United States Patent
Morita et al.

(10) Patent No.: US 6,738,175 B2
(45) Date of Patent: May 18, 2004

(54) LIGHT EMITTING DEVICE

(75) Inventors: Daisuke Morita, Anan (JP); Motokazu Yamada, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/149,755

(22) PCT Filed: Dec. 12, 2000

(86) PCT No.: PCT/JP00/08768

§ 371 (c)(1),
(2), (4) Date: Jun. 13, 2002

(87) PCT Pub. No.: WO01/43206

PCT Pub. Date: Jun. 14, 2001

(65) Prior Publication Data

US 2002/0179923 A1 Dec. 5, 2002

(30) Foreign Application Priority Data

Dec. 13, 1999 (JP) ............................................ 11-353256
Nov. 21, 2000 (JP) ...................................... 2000-353833

(51) Int. Cl.$^7$ .............................. G02F 1/03; G02F 1/07; H01L 29/201; H01L 29/16; H01L 29/18
(52) U.S. Cl. ........................... 359/248; 257/90; 257/13; 257/82; 257/88; 438/46; 438/47
(58) Field of Search ............................ 257/90, 13, 82, 257/88, 79; 438/46, 47; 359/227, 248, 344

(56) References Cited

U.S. PATENT DOCUMENTS 5,990,496 A * 11/1999 Kunisato et al. .............. 257/94
6,162,656 A * 12/2000 Kunisato et al. .............. 438/46
6,323,059 B1 * 11/2001 Yoshida et al. ............. 438/106
6,388,275 B1 * 5/2002 Kano ........................... 257/94
2002/0030201 A1 * 3/2002 Uemura ...................... 257/189

FOREIGN PATENT DOCUMENTS

| EP | 1 168 539 A1 | 1/2002 |
| JP | 9-266351 A | 10/1997 |
| JP | 10-12922 A | 1/1998 |
| JP | 10-229217 | 8/1998 |
| JP | 10-242585 A | 9/1998 |
| JP | 11-74621 | 3/1999 |
| JP | 11-251685 A | 9/1999 |
| JP | 11-307866 A | 11/1999 |
| JP | 2000-91629 A | 3/2000 |
| JP | 2001-53339 A | 2/2001 |
| WO | 00/52796 A1 | 9/2000 |

OTHER PUBLICATIONS

Jpn. J. Appl. Phys., Vol 38, Part 1, No. 7A (1999), pp. 3976–3981.
Materials Science and Engineering B59 Nos. 1–3 (1999), pp. 315–318.

* cited by examiner

Primary Examiner—Georgia Epps
Assistant Examiner—Brandi Thomas
(74) Attorney, Agent, or Firm—Nixon & Vanderhye, P.C.

(57) ABSTRACT

To enhance the emission output of the light emitting device including an active layer made of nitride semiconductor containing In, the light emitting device having an active layer between the n-type semiconductor layer and the p-type semiconductor layer, characterized in that the active layer comprises an well layer made of $In_{x1}Ga_{1-x1}N$ (x1>0) containing In and a first barrier layer made of $Al_{y2}Ga_{1-y2}N$ (y2>0) containing Al formed on the well layer.

23 Claims, 12 Drawing Sheets

Crystal growth Direction

LIGHT EMITTING DEVICE

This application is the U.S. National phase of international application PCT/JP00/08768 filed Dec. 12, 2000 which designates the U.S. PCT/JP00/08768 claims priority to JP Application No. 11/353256 filed Dec. 13, 1999 and JP Application No. 2000/353833 filed Nov. 21, 2000. The entire contents of these applications are incorporated herein by reference

BACKGROUND OF THE INVENTION

1. Field of the Invention

This invention relates to a light emitting device provided with a nitride semiconductor (for example, $In_xAl_yGa_{1-x-y}N$, $0 \leq x$, $0 \leq y$, $x+y \leq 1$) including light emitting devices such as LED (light emitting diode) and LD (laser diode).

2. Prior Art

Recently, the light emitting device including nitride semiconductor layers such as a blue LED or LD has attracted attention. Since the device made of nitride semiconductor has a high melting temperature and a relatively high heat resistance, it has a small temperature dependence and is expected to find application in not only light emitting devices but also various kinds of devices.

Also, the LED has excellent properties such as low power consumption and long lifetime and has an effect on the economy of power consumption and the decrease of maintenance frequency. Therefore, the LED holds promise as a light emitting source for the traffic signals and a high bright LED which can give sufficient visual identification outdoors is expected to be developed. The light in the yellow region is, often used in an indicator that attracts attention such as directional signals of the car and a bulletin board for traffic information other than the aforementioned traffic signal.

The LED made of AlGaInP has been already realized as the high bright LED which emits the light having a wavelength in the yellow region. However, the LED made of AlGaInP had large temperature dependence and particularly, the emission output thereof decreased extremely at an elevated temperature. Such a decrease of the emission output at an elevated temperature becomes a large problem, particularly in the indicator which is mounted outdoors. This is because generally, the temperature within the indicator is very high in summer when the solar radiation is very strong or in the regions such as tropic zones and the decrease of the emission output in the situations that the solar radiation is very strong leads to the decrease of the visual identification. Such a fact becomes an extremely large problem for the indicator which emits light in the yellow region and is often used as an indicator that attracts attention.

It is known that the active layer is made of mixed crystal containing indium (In) and the mixing ratio x of In is large to decrease the band gap energy, with the result that the wavelength of the emitted light is long, so as to emit the light having a wavelength in the yellow region corresponding to yellow of the traffic signals in the light emitting device including nitride semiconductor layers (for example, $In_xAl_yGa_{1-x-y}N$, $0 \leq x$, $0 \leq y$, $x+y \leq 1$) However, if the wavelength of the emitted light is made long by increasing the mixing ratio of indium in the active layer to emit the light having a wavelength in the yellow region using the light emitting device having nitride semiconductor layers, the problem of decrease the emission output with increase of the mixing ratio of indium comes up. The emission output decreases markedly from the point where the emitting wavelength λd is about 550 nm. Further, the active layer including indium (In) in the amount required to achieve an emitting wavelength of about 590 nm has an extremely bad surface state and then, the problem that the semiconductor layers having a good crystallinity cannot be formed on such a surface thereof comes up.

SUMMARY OF THE INVENTION

This invention has been accomplished to solve the above-mentioned problems. It is an object of the present invention to enhance the emission output of the light emitting device including an active layer made of nitride semiconductor containing In, particularly, of the light emitting device which emits a light having a wavelength longer (not less, than 550 nm) than that in the yellow region. It is another object of the present invention to enhance the crystallinity of the semiconductor layers which are formed on the nitride semiconductor layer which emits the light having a wavelength in the yellow region.

To achieve the above-mentioned object, according to the present invention, there is provided a light emitting device having an active layer between the n-type semiconductor layer and the p-type semiconductor layer, characterized in that the active layer comprises an well layer made of $In_{x1}Ga_{1-x1}N$ (x1>0) containing In and a first barrier layer made of $Al_{y2}Ga_{1-y2}N$ (y2>0) containing Al formed on the well layer.

In the light emitting light device having such a structure according to the present invention, the emission output of the nitride semiconductor light emitting device, particularly of the light emitting device comprising a nitride semiconductor layer which emits a light having a wavelength longer than that in the yellow region can be enhanced. Also, the semiconductor layers formed on the well layer and the first barrier layer can be improved in crystallinity.

Also, in the light emitting device according to the present invention, the well layer is made of ternary mixed crystal, $In_{x1}Ga_{1-x1}N$ ($0.6 \leq x1 \leq 1$), resulting in that the well layer and the first barrier layer formed thereon can be improved in crystallinity and the semiconductor layers formed on the first barrier layer can be further improved in crystallinity.

In the light emitting device according to the present invention, the well layer may contain Al that is diffused from the adjacent layer.

In the light emitting device according to the present invention, the first barrier layer may contain In that is diffused from the adjacent layer.

In the light emitting device according to the present invention, the mixing proportion x1 of In in the well layer is controlled to be not less than 0.6, resulting in the light emission of a wavelength in the yellow region or longer.

Also, in the light emitting device according to the present invention, the mixing proportion x1 of In in the well layer is preferably adjusted to obtain the light emission having a wavelength of not less than 530 nm.

Further, in the light emitting device according to the present invention, the mixing proportion y of Al in the first barrier layer is preferably not less than 0.1, resulting in, particularly, the improvement of the emission output of the device which emits the light having a wavelength in the yellow region or longer.

And the mixing proportion y of Al in the first barrier layer is more preferably adjusted to be not less than 0.15, most preferably not less than 0.2.

Thus, the increase of the mixing proportion y2 of Al in the first barrier layer enables the threshold voltage to be decreased.

And in the light emitting device according to the present invention, the active layer preferably comprises a second barrier layer made of $In_{x3}Al_{y3}Ga_{1-x3-y3}N$, ($0 \leq x3 \leq 0.3$, $0 \leq y3 \leq 0.1$, $x3+y3 \leq 0.3$) and thereby, the well layer formed thereon can be improved in crystallinity.

And in the light emitting device according to the present invention, the second barrier layer is more preferably made of ternary mixed crystal, $In_{x3}Ga_{1-x3}N$ ($0 \leq x3 \leq 0.3$) or binary mixed crystal, GaN which corresponds to $x3=0$ and thereby, the crystal defects due to the difference in the lattice constant between the barrier layer and the well layer can be decreased and the deterioration of the crystallinity of the second barrier layer itself due to high mixed crystallization of In can be prevented, resulting in the improvement of the well layer in cystallinity.

Since the light emitting device according to the present invention comprises the second barrier layer, the well layer and the first barrier layer, even when the mixing proportion of In is large, the active layer having a good crystallinity can be formed. Such an active layer may be more suitable for the active layer in the multi-quantum-well structure.

And in the light emitting device according to the present invention, it is preferable that the n-type semiconductor layer comprises an n-type cladding layer to confine the carrier within the active layer and the p-type semiconductor layer comprises a p-type cladding layer to confine the carrier within the active layer, the device comprising an n-side second cladding layer made of nitride semiconductor containing In between the active layer and the n-type cladding layer and a p-side second cladding layer made of nitride semiconductor containing In between the active layer and the p-type cladding layer.

In the light emitting device in such a configuration, the n-side second cladding layer and the p-side second cladding layer can prevent the deterioration of the crystallinity and the occurrence of the undesirable distortion in the active layer due to the difference in the lattice constant between the n-type cladding layer and the p-type cladding layer, resulting in the enhancement of the emission output.

As described above, according to the present invention, the emission output of the nitride semiconductor device, particularly the nitride semiconductor light emitting device which emits the light having a wavelength longer than that in the yellow region (not less than 550 nm) can be enhanced. The cystallinity of the nitride semiconductor layers on the nitride semiconductor layer from which the light having a wavelength in the yellow region is emitted can be improved.

Particularly, in the case that the mixing proportion of Al, y2 in the first barrier layer is not less than 0.1, that is, $y2 \geq 0.1$, the above-mentioned effect is brought to the fore. Further, the effect is also produced on the decrease of the threshold voltage of the light emitting device on condition that $y2 \geq 0.15$, preferably $y2 \geq 0.2$.

DETAILED DESCRIPTION OF THE PREFERRED EMBODIMENTS

Embodiment 1

Figure 1:
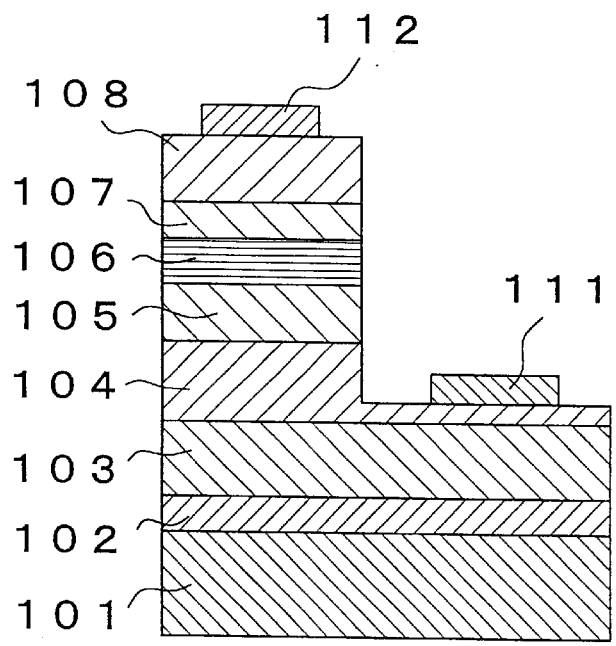
FIG. 1 is a schematic cross sectional view of the light emitting diode of the first embodiment according to the present invention.

FIG. 1 is a schematic view showing the configuration of the light emitting diode according to the first embodiment of the present invention. The light emitting diode has such a configuration as a buffer layer 102, an undoped GaN layer 103, an n-type contact layer 104, an n-type cladding layer 105, an active layer 106, a p-type cladding layer 107 and a p-type contact layer 108 are successively laminated on a substrate 101 and an n-electrode and a p-electrode are formed on the n-type contact layer and the p-type contact 108, respectively.

The substrate 101 is used to form desirable nitride semiconductor layers ($In_xAl_yGa_{1-x-y}N$, $0 \leq x$, $0 \leq y$, $x+y \leq 1$) thereon and selected appropriately. The buffer layer 102 is formed for the purpose of relaxing lattice constant mismatch between the substrate 101 and the nitride semiconductor ($In_xAl_yGa_{1-x-y}N$, $0 \leq x$, $0 \leq y$, $x+y \leq 1$). The undoped GaN layer 103 is formed for the purpose of improving the n-type contact layer 104 which is to be formed thereon in crystallinity. The n-type contact layer 104 is formed for the purpose of realizing the ohmic contact. The n-type cladding layer 105 is formed for the purpose of confining the carrier within the active layer 106. The active layer 106 is formed to emit light. The p-type cladding layer 107 is formed for the purpose of confining the carrier within the active layer 106, like the n-type cladding layer 105. The p-type contact layer 108 is formed for the purpose of realizing the ohmic contact with the p-electrode 112.

The substrate 101, the buffer layer 102 and the undoped GaN layer 103 of the above-mentioned light emitting device may be removed selectively, if necessary, for the purpose of the enhancement of the emission output and the decrease of internal absorption of the light, after the formation of each layer on said substrate and said layers. In this specification, The growing direction of each layer is defined as upper direction. Therefore, in the embodiment 1, the p-type semiconductor layers are in the upper direction from the n-type semiconductor layers.

Components of the nitride semiconductor light emitting diode of the first embodiment according to the present invention will now be described in details below.

The substrate 101 may be made of, in addition to sapphire having the principal plane in C plane, sapphire having principal plane in R plane or A plane, insulating substrate such as spinel ($MgAl_2O_4$), or other semiconductor substrate such as SiC(including 6H, 4H 3C), ZnS, ZnO, GaAs and GaN.

The buffer layer 102 is formed for the purpose of relaxing lattice constant mismatch between the substrate 101 and the nitride semiconductor ($In_xAl_yGa_{1-x-y}N$, $0 \leq x$, $0 \leq y$, $x+y \leq 1$) and for example, is formed by growing AlN, GaN, AlGaN, InGaN, etc. The buffer layer 102 may be formed at a temperature of not more than 900° C. to a thickness of 10 angstroms to 500 angstroms.

The undoped GaN layer 103 is made as a GaN layer which is not doped with an impurity. According to the Embodiment 1, the undoped PaN layer 103 is further formed on the buffer layer 102, to improve in crystallinity the n-type contact layer 104 which is to be formed on the undoped GaN layer 103.

The n-type contact layer 104 is usually doped with an n-type impurity such as Si in a concentration of not less than $3 \times 10^{18}/cm^3$ and preferably not less than $5 \times 10^{18}/cm^3$. The composition of the n-type contact layer 104 may be $In_{x5}Al_{y5}Ga_{1-x5-y5}N$, ($0 \leq x5$, $0 \leq y5$, $x5+y5 \leq 1$), but the present invention is not limited to such a composition. The n-type contact layer may be preferably made of GaN or $Al_yGa_{1-y}N$ (the value of y is not more than 0.2) to obtain a nitride semiconductor layer with few crystal defects. The thickness of the n-type contact layer 104 is controlled to be 0.1 to 20 μm, preferably 0.5 to 10 μm, and more preferably 1 to 5 μm so as to form an n-electrode 111 thereon, but is not limited to the above-mentioned range.

Next, the n-type cladding layer 105 is preferably in the structure comprising at least three layers of a undoped n-type cladding first layer, a n-type cladding second layer doped with an n-type impurity and a undoped n-type cladding third layer. And the n-type cladding layer 105 may further comprise layers other than the aforementioned first to third layers. The n-type cladding layer 105 may be close to the active layer 106. Otherwise, there may be provided another layer between the n-type cladding layer and the active layer 106.

The n-type cladding first to third layers may be made of various composition of nitride semiconductor ($In_xAl_yGa_{1-x-y}N$, $0 \leq x$, $0 \leq y$, $x+y \leq 1$), but may be preferably made of GaN. The composition of one of the first to third layers of the n-type cladding layer 104 may be different from that of the other layers or may be the same as that of the other layers. The thickness of the n-type cladding layer 105 is controlled to be preferably 175 to 12000 angstroms, more preferably 1000 to 10000 angstroms and most preferably 2000 to 6000 angstroms, but is not limited to the above-mentioned range. If the thickness of the n-type cladding layer 105 is within the above-mentioned range, the optimization of Vf can be achieved and the withstand static voltage can be enhanced.

The total thickness of the cladding layer 105 may be preferably controlled to be within the aforementioned range by controlling each thickness of the first to third layers of the n-type cladding layer appropriately. Each layer which constitutes the n-type cladding layer 105 may be made of semiconductor having a composition of $In_xAl_yGa_{1-x-y}N$, ($0 \leq x$, $0 \leq y$, $x+y \leq 1$), preferably a composition $In_xAl_yGa_{1-x-y}N$ having a low mixing proportion of In and Al, more preferably GaN.

Figure 2:
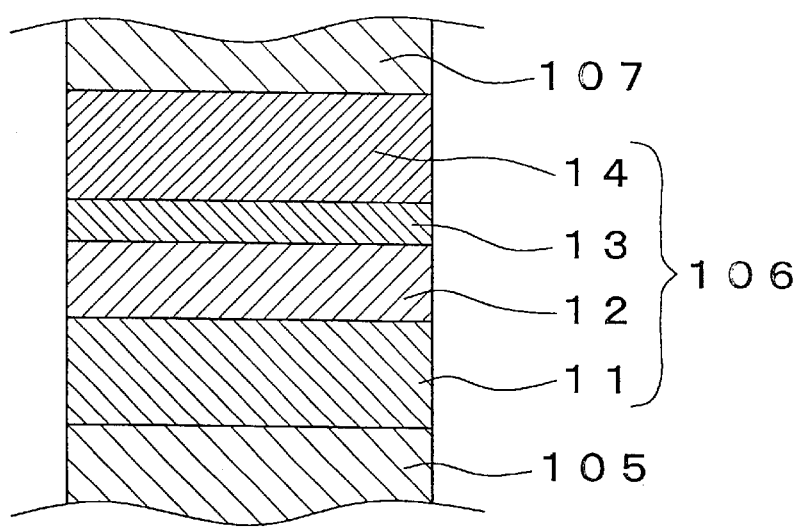
FIG. 2 is a schematic cross sectional view showing the configuration of the active layer of the first embodiment.

In the first embodiment, the active layer 106 having a single quantum well structure, as shown in FIG. 2, is formed on the n-type cladding layer 105. The active layer 106 comprises a second barrier layer 11 which is formed under the well layer 12, an well layer 12 where the carrier is recombined and the light emitted and a first barrier layer 13 which is formed on the well layer 12. Further, the uppermost layer 14 is formed on the first barrier layer 13 to grow the p-type cladding layer 107 having a good crystallinity.

The second barrier layer 11 is made of, for example, nitride semiconductor represented by the general formula, $In_{x3}Al_{y3}Ga_{1-x3-y3}N$, ($0 \leq x3$, $0 \leq y3$, $x3+y3 \leq 0.1$) including 2 or more elements selected from indium (In), aluminum (Al), gallium (Ga) and nitrogen (N). The second barrier layer 11 preferably has a mixing proportion x3 or y3 of In or Al, respectively, of $x3 \leq 0.3$, $y3 \leq 0.3$, $x3+y3 \leq 0.3$, in order to form thereon an well layer 12 which has a good crystallinity and is made of nitride semiconductor having a large mixing proportion of In required to emit light having a wavelength in the yellow wavelength. In particular, the second barrier layer is preferably made of ternary mixed crystal of $In_{x3}Ga_{1-x33}N$, ($x3 \leq 0.3$) or binary mixed crystal of GaN to decrease the crystal defects due to the difference in lattice constant between the second barrier layer 11 and the well layer 12 and to prevent the deterioration in crystallinity of the lower barrier layer 11 itself as the mixing proportion of In increases. In such a case, the cystallinity of the well layer 12 which is formed on the second barrier layer 11 can be enhanced. The thickness of the second barrier layer 11 is preferably 10 angstroms to 100 angstroms to improve the well layer 12 in crystallinity.

The well layer 12 is made of, for example, $In_{x1}Al_{y1}Ga_{1-x1-y1}N$, ($x1>0$, $y1 \geqq 0$, $x1+y1 \leqq 1$) including indium (In), aluminum (Al), gallium (Ga) and nitrogen (N). The mixing proportion of indium (In), aluminum (Al) and gallium (Ga) is determined in such a manner that the peak wavelength, λd is within the range of from 550 nm to 610 nm or the range beyond such a range, where the effective yellow light emission can be obtained. In particular, the mixing proportion, x1 of indium (In) in the well layer 12 is controlled to be $x1 \geqq 0.6$ to obtain a preferable wavelength of yellow light.

However, as the mixing proportion x1 of In increases, the lattice constant increases and the lattice mismatch between the well layer and the other layers increases. Therefore, the well layer 12 is needed to be formed on the layer having a relatively small lattice constant difference from that of the well layer 12 and having a good crystallinity. According to the present invention, the well layer 12 is formed in combination with the above-mentioned second barrier layer 11 and therefore, the well layer 12 having a good crystallinity can be formed. Moreover, even the layer of which the lattice constant is largely different from that of the well layer 12 can be formed to have a good crystallinity. The well layer 12 may be preferably made of ternary mixed crystal of $In_{x1}Ga_{1-x1}N$ or binary mixed crystal of GaN, so as to grow the layer having a good crystallinity. The thickness of the well layer 12 is preferably 10 angstroms to 100 angstroms.

The first barrier layer 13 is made of, for example, $In_{x2}Al_{y2}Ga_{1-x2-y2}N$, ($x2 \geqq 0$, $y2 \geqq 0$, $x2+y2 \leqq 1$) including indium (In), aluminum (Al), gallium (Ga) and nitrogen (N). The first barrier layer 13 includes aluminum (Al) as an essential element and therefore, the output of the light having a wavelength in the yellow region which is emitted in the well layer 12 can be enhanced. When the first barrier layer 13 is formed of such a composition, the uppermost layer 14 having a good crystallinity can be formed on the first barrier layer 13. The first barrier layer 13 may be preferably made of ternary mixed crystal of $Al_{y2}Ga_{1-y2}N$, so as to grow the layer having a good crystallinity. The mixing proportion of Al is preferably $y2 \geqq 0.1$, more preferably $y2 \geqq 0.15$. The band gap energy of the first barrier layer 13 is preferably higher than that of the second barrier layer 11. The thickness of the first barrier layer 13 is preferably 10 angstroms to 100 angstroms.

The uppermost layer 14 is made of, for example, $In_{x4}Al_{y4}Ga_{1-x4-y4}N$, ($0 \leqq x4$, $0 \leqq y4$, $x4+y4 \leqq 0.1$) including indium (In), aluminum (Al), gallium (Ga) and nitrogen (N). The uppermost layer 14 is preferably controlled to have a mixing proportion of In or Al of $0 \leqq x4$, $y4 \leqq 0.1$ and $x4+y4 \leqq 0.1$, so as to grow a p-type cladding layer having a good crystallinity on the uppermost layer 14. Moreover, the upper most layer 14 may be preferably made of ternary mixed crystal of $Al_{y4}Ga_{1-y4}N$ or binary mixed crystal of GaN, so as to grow the p-type cladding layer 107 having a good crystallinity thereon. The thickness is preferably 10 angstroms to 100 angstroms. The uppermost layer 14 may have the same constitution as that of the second barrier layer 11.

The above-mentioned each layer of the active layer 106 may be selected appropriately from an undoped layer without an impurity, an n-type doped layer which is doped with an n-type impurity such as Si and a p-type doped layer which is doped with a p-type impurity such as Mg.

Figure 3:
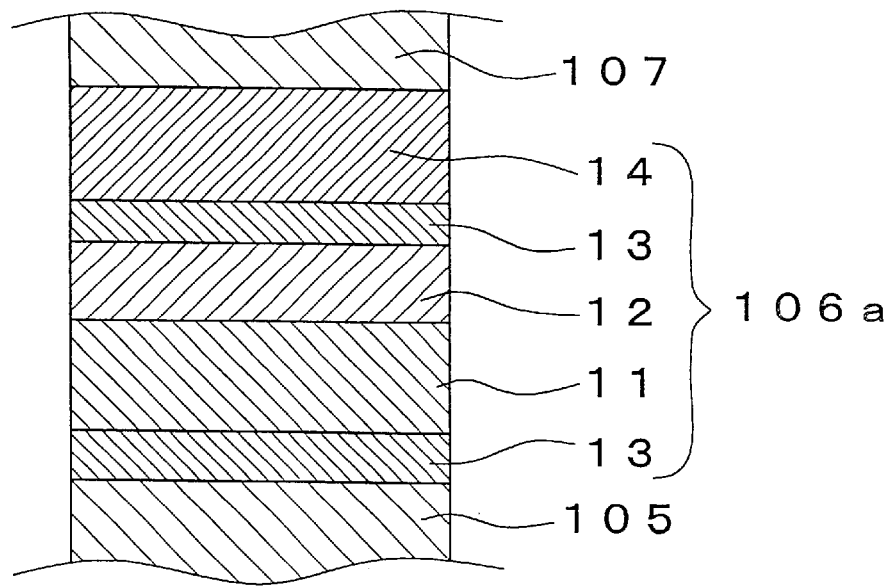
FIG. 3 is a schematic cross sectional view showing the configuration of the active layer of a modified example of the first embodiment.

According to the first embodiment, the active layer is made by laminating successively the second barrier layer 12, the well layer 12, the first barrier layer 13 and the uppermost layer 14 on the n-type cladding layer 105. However, the present invention is not limited to this configuration. And instead of the active layer, as shown in FIG. 3, the active layer 106a can be used which is made by laminating successively the first barrier layer 13, the second barrier layer 11, the well layer 12, the first barrier layer 13, the uppermost layer 14. Thus, the first barrier layer 13 having a band gap energy higher than that of the second barrier layer 11 is formed on the n-type cladding layer 105 side with respect to the well layer 12 to confine the carrier more effectively within the well layer 12.

Figure 4:
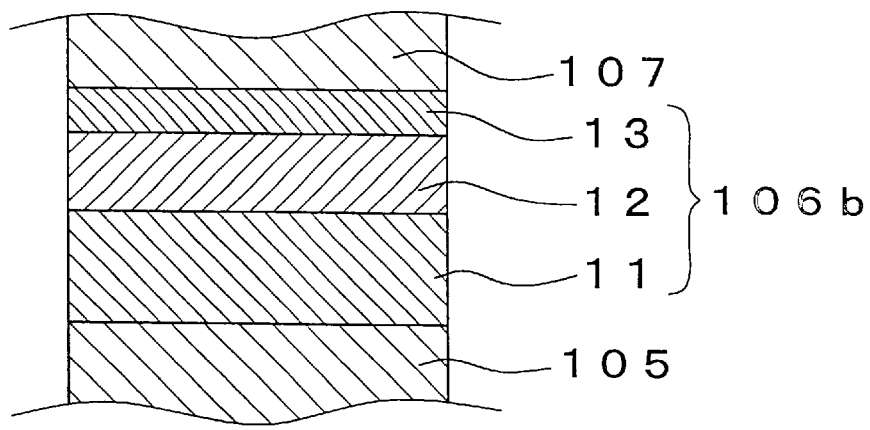
FIG. 4 is a schematic cross sectional view showing the configuration of the active layer of another modified example of the first embodiment.

As long as the lattice constant of the first barrier layer 13 matches the lattice constant of the p-type cladding layer 107, instead of the active layer, as shown in FIG. 4, the active layer 106b in which the uppermost layer 14 is omitted can be used. Certainly, the active layer may be formed by laminating the first barrier layer 13, the second barrier layer 11, the well layer 12 and the first barrier layer.

In other words, according to the present invention, there may be provided only a first barrier layer 13 containing Al on at least one well layer. As long as the minimum requirements can be satisfied, various modifications can be made.

A p-type cladding layer 107 is formed on the active layer 106. The p-type cladding layer 107 may be a multi-layered film form by laminating the the p-type cladding first layer having a higher band gap energy and the p-type cladding second layer having a band gap energy lower than that of the first layer, or may be a single layer made of $Al_bGa_{1-b}N$, ($0 \leqq b \leqq 1$) containing a p-type impurity. When a multi-layered film, the concentration of the p-type impurity of the p-type cladding first layer may be different from or the same as that of the p-type cladding second layer.

Next, the p-type cladding layer 107 having a multi-layered structure (super lattice structure) will be described in details below.

The thickness of the p-type cladding first layer and the p-type cladding second layer which constitute the p-side cladding layer 107 which is a multi-layered film is controlled to be not more than 100 angstroms, preferably not more than 70 angstroms and more preferably within the range of 10 to 40 angstroms. The thickness of the p-type cladding first layer may be the same as or different from that of the p-type cladding second layer. When the thickness of each layer constituting the multi-layered film is controlled to be within the above-mentioned range, the thickness of each layer is within the elastic strain limit and the nitride semiconductor layer having a better crystallinity can be grown compared to the case of a large thickness. Since the nitride semiconductor layer having a good crystallinity can be grown, when a p-type impurity is doped, the p-type layer having a large carrier concentration and a small resistivity can be obtained, resulting in the decrease of Vf and threshold of the device. Two kinds of layers having such a thickness is defined as one pair and the multi-layered film is formed by laminating the pairs several times. The total thickness of the p-type multi-layered cladding layer is controlled by adjusting the thickness of each layer of the p-type cladding first layer and the p-type cladding second layer and adjusting the lamination times. The total thickness of the p-type multi-layered cladding layer is not specified, but is not more than 2000 angstroms, preferably not more than 1000 angstroms, and more preferably not more than 500 angstroms.

The p-type cladding first layer is desirably made by growing the nitride semiconductor containing at least Al, preferably $Al_nGa_{1-n}N$ ($0<n\leq1$) and the p-type cladding second layer is desirably made by growing the nitride semiconductor of binary mixed crystal or ternary mixed crystal such as AlpGa1–pN ($0\leq p<1, n>p$) and $In_rGa_{1-r}N$ ($0\leq r\leq1$).

In the p-type cladding layer, the p-type impurity concentration of the p-type cladding first layer is different from that of the p-type cladding second layer. One layer has a larger impurity concentration and the other layer had a smaller impurity concentration. As in the case of the n-type cladding layer 105, the p-type cladding first layer having a higher band gap energy preferably has a p-type impurity concentration larger than that of the p-type cladding second layer having a lower band gap energy. The p-type cladding second layer having a lower band gap energy is preferably an undoped layer. However, the present invention is not limited to the above-mentioned configuration. And the p-type cladding first layer having a higher band gap energy may have a p-type impurity concentration smaller than that of the p-type cladding second layer having a lower band gap energy.

The amount of doping in the p-type cladding first layer is preferably controlled within a range from $1\times10^{18}/cm^3$ to $1\times10^{21}/cm^3$, or more preferably within a range from $1\times10^{19}/cm^3$ to $5\times10^{20}/cm^3$. When the impurity concentration is lower than $1\times10^{18}/cm^3$, the carrier concentration is low. On the other hand, when the impurity concentration is higher than $1\times10^{21}/cm^3$, the crystallinity deteriorates. Meanwhile the p-type impurity concentration in the p-type cladding second layer may be at any level as long as it is lower than that of the p-type cladding first layer, but it is preferably lower than on tenth of the latter. Most preferably the p-type cladding second layer is undoped, in which case a layer of high mobility can be obtained. However, because the p-type cladding second layer is thin, some of the p-type impurity diffuses from the p-type cladding first layer into the p-type cladding first layer. Therefore, the p-type impurity concentration in the p-type cladding second layer including the above-mentioned diffusing impurity is desirably within $1\times10^{20}/cm^3$ and lower than that in the p-type cladding first layer. The effect is the same also in case that the p-type cladding first layer having a higher band gap energy is doped with less amount of p-type impurity and the p-type cladding second layer having a lower band gap energy is doped with greater amount of p-type impurity.

The p-type impurity is selected from among the elements of IIA group and IIB group of the periodic table such as Mg, Zn, Ca and Be and preferably selected from among Mg, Ca and the like.

In component nitride semiconductor layer constituting the p-type cladding layer 107 in the multi-layered structure, the layer doped with the impurity in a higher concentration is preferably doped so that such a distribution of impurity concentration is obtained, that the impurity concentration is high in the middle portion of the semiconductor layer in the direction of thickness and is low (preferably undoped) in the portions near the ends, resulting in the,decrease of the resistivity.

Next, the p-type cladding layer 107 in the single layer structure made of $Al_bGa_{1-b}N$ ($0\leq b\leq1$) containing a p-type impurity will be described bellow. The thickness of the p-side cladding layer 107 is controlled to be within 2000 angstroms, preferably within 1000 angstroms and more preferably within a range from 100 to 500 angstroms.

The p-type cladding layer 107 in the single layer structure has a little worse crystallinity compared to the p-type cladding layer in the multi-layered structure. The p-type cladding layer 107 in the single layer structure in combination with the n-type cladding layer 105 in the multi-layered structure can provide a good crystallinity. Thus, the use of such a single layer in combination with other layer configuration can prevent the deterioration of the device properties. Such a single layer can allow the manufacturing process to be simplified and is suitable to mass production.

The p-type impurity concentration in the p-type cladding layer 107 in the single layer structure is controlled within a range from $1\times10^{18}/cm^3$ to $1\times10^{21}/cm^3$, preferably within a range from $5\times10^{18}/cm^3$ to $5\times10^{20}/cm^3$, and more preferably within a range from $5\times10^{19}/cm^3$ to $1\times10^{20}/cm^3$. When the impurity concentration is within the aforementioned range, a good p-type film can be obtained.

According to the present invention, it is preferable that the p-type contact layer 108 is doped with Mg and the composition of the layer is binary mixed crystal nitride semiconductor, GaN, including no indium and no aluminum. If the p-type contact layer includes In or Al, good ohmic contact thereof with the p-electrode 112 can be obtained, resulting in the decrease of luminous efficiency. The thickness of the p-side contact layer 108 is within the range from 0.001 μm to 0.5 μm, preferably within the range from 0.01 μm to 0.3 μm and more preferably within the range from 0.05 μm to 0.2 μm. When the thickness of the p-side contact layer is less than 0.001 μm, a short circuit may easily occur between the p-electrode 112 and the p-type GaAlN cladding layer, resulting in the deterioration of function of the p-side contact layer 108. Since the GaN contact layer of binary mixed crystal which has a composition different from that of the contact layer is formed on the GaAlN cladding layer of ternary mixed crystal, in the case of the thickness being more than 0.5 μm, crystal defects tend to occur in the p-side GaN contact layer 9 due to crystal mismatch, resulting in the deterioration of crystallinity. In term of the luminous efficiency, the less the thickness of the contact layer, the lower Vf is, with the result that the luminous efficiency can be enhanced. The p-type impurity which is doped in the p-type GaN contact layer 9 is preferably Mg, and thereby, the p-type characteristic can be easily achieved and the ohmic contact can be easily achieved. The concentration of Mg is controlled within a range of from $1\times10^{18}/cm^3$ to $1\times10^{21}/cm^3$, preferably within a range from $5\times10^{19}/cm^3$ to $3\times10^{20}/cm^3$, and more preferably to about $1\times10^{20}/cm^3$.

The p-type contact layer 108 may be composed of a p-type contact first layer made of undoped GaN and a p-type contact second layer made of Mg doped GaN.

The n-electrode 111 is formed on the n-type contact layer 104, and the p-electrode 112 is formed on the Mg doped p-type GaN contact layer 9. In the present invention, the material of the n- and p-electrodes 111, 112 is not specified but for example, the n-electrode 111 may be made of W/Al and the p-electrode 112 may be made of Ni/Au.

In the light emitting diode of the first embodiment, because the active layer 16 comprises a first barrier layer on an well layer, the carrier can be more efficiently confined within the well layer to enhance the luminous efficiency.

Embodiment 2

The light emitting diode of the second embodiment according to the present invention will be described below.

As described above, since the well layer 12 and the layer formed on the first barrier layer can have a good crystallinity, the present invention can be applied to the multi quantum well structure.

Figure 5:
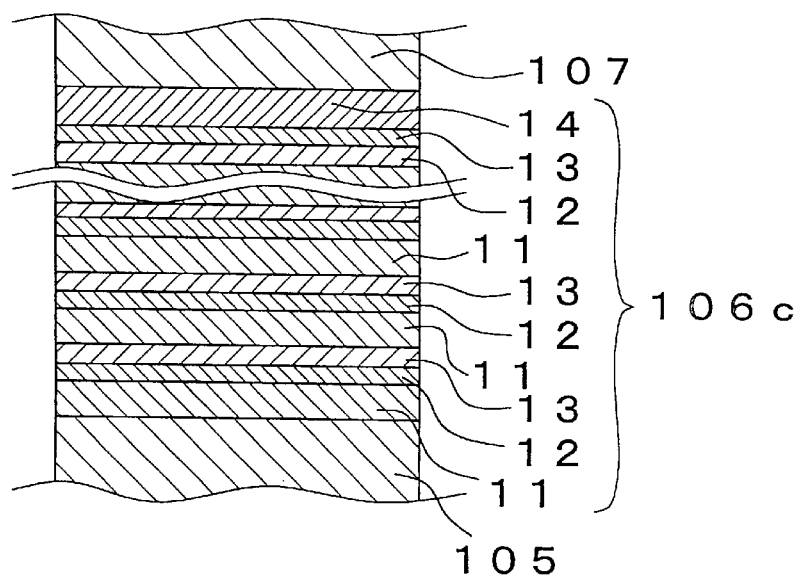
FIG. 5 is a schematic cross sectional view showing the configuration of the active layer of the second embodiment.

The light emitting device of the second embodiment according to the present invention is a light emitting diode comprising an active layer 106c having a multi quantum well structure, as shown in FIG. 5, instead of the active layer 106 of the light emitting device of the first embodiment. The light emitting diode of the second embodiment has a similar configuration to that of the first embodiment except for the active layer.

In the light emitting device of the second embodiment, the active layer 106c having a multi quantum well structure is formed by laminating a second barrier layer 11, an well layer 12 and a first barrier layer in this order over and over again. In this case, an uppermost layer 14 is formed after the top first barrier layer is formed. The second barrier layer 11, the well layer 12, the first barrier layer 13 and the uppermost layer 14 which constitute the active layer 106c are formed in the same way as in the first embodiment.

The light emitting device of the second embodiment which has such a configuration has excellent properties as described below.

In the prior yellow light emitting device without the first barrier layer containing Al, the active layer was in the form of a multi quantum well structure including several well layers and the crystallinity is deteriorated, resulting in the decrease of the emission output.

However, in the yellow light emitting device comprising a first barrier layer containing Al as an essential element, even if the active layer is formed in a multi quantum well structure including several well layers 12, the emission output can be enhanced, in contrast to the prior device.

Figure 6:
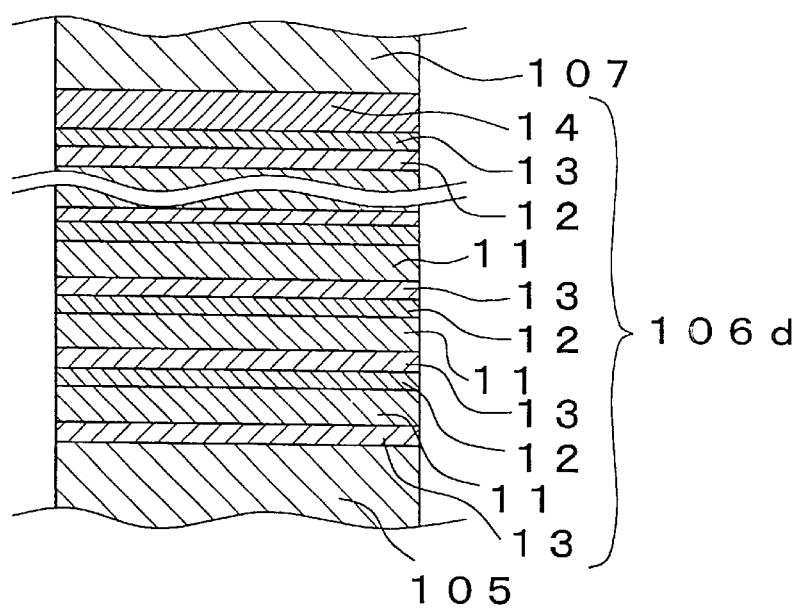
FIG. 6 is a schematic cross sectional view showing the configuration of the active layer of a modified example of the second embodiment.

The configuration in which the second barrier layer 11, the well layer 12 and the first barrier layer 13 are formed in this order over and over again on the n-type cladding layer 105 and finally, the uppermost layer 14 is formed has been described. However, according to the present invention, as shown in FIG. 6, the first barrier layer 13 is formed on the n-type cladding layer 105, and then, the active layer 106d may be made by laminating the second barrier layer 11, the well layer 12 ant the first barrier layer in this order over and over again and finally forming the uppermost layer 14 like in FIG. 5. Thus, when the first barrier layer 13 having a band gap energy higher than that of the second barrier layer 11 in the side of the n-type cladding layer with respect to the first well layer 12, the carrier can be confined more effectively within the first well layer 12.

Figure 7:
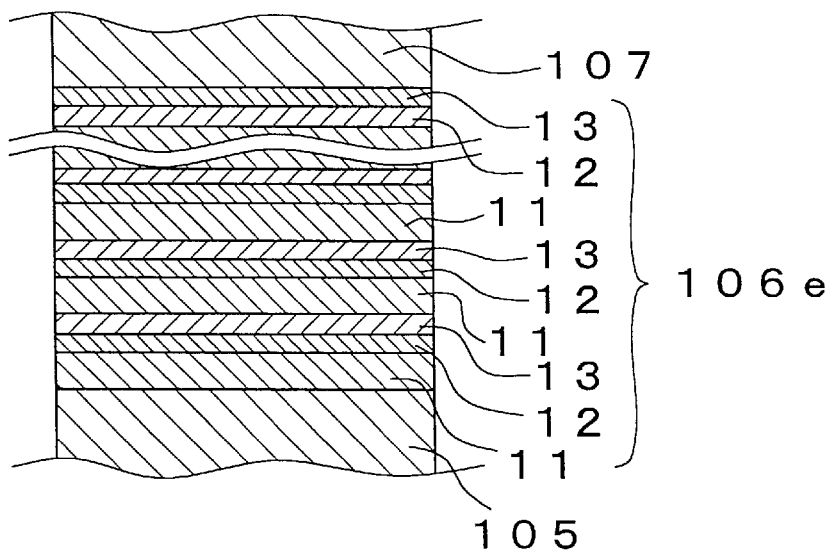
FIG. 7 is a schematic cross sectional view showing the configuration the active layer of another modified example of the second embodiment.

As long as the lattice constant of the first barrier layer 13 matches that of the p-type cladding layer 107, the uppermost layer 14 may be omitted in the active layer 106d of FIG. 6, as shown in FIG. 7. The active layer having such a configuration is designated as 106e in FIG. 7. Certainly, in the active layer 106d which is formed by laminating the second barrier layer 11, the well layer 12 and the first barrier layer in this order over and over again after the format-on of the first barrier layer 13 on the n-type cladding layer 105, the uppermost layer 14 may also be omitted.

As described above, in the light emitting device according to the present invention, various modifications can be made as long as a first barrier layer containing Al is formed on at least one well layer.

Therefore, the present invention can be applied to the laser device as described below.

Embodiment 3

The light emitting laser device of the third embodiment according to the present invention will be described.

Figure 8:
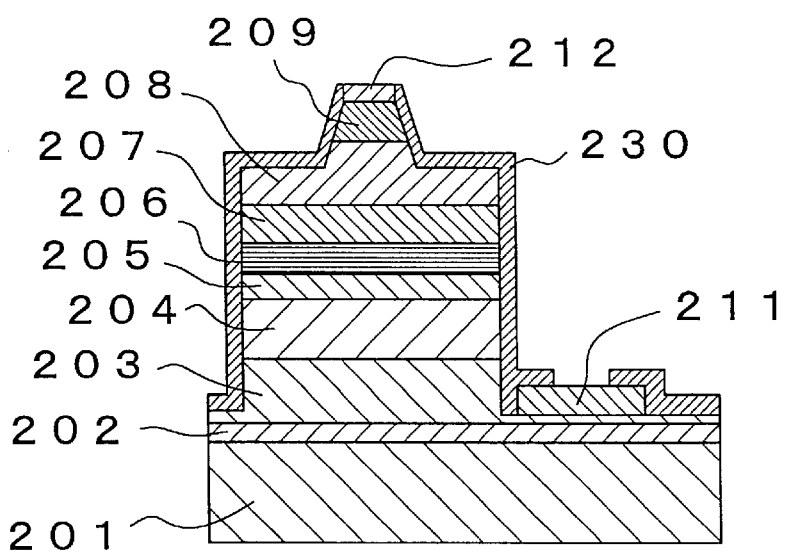
FIG. 8 is a schematic cross sectional view showing the configuration of the laser diode of the third embodiment according to the present invention.

FIG. 8 is a schematic view showing the configuration of the semiconductor laser device according to the third embodiment of the present invention.

In the nitride semiconductor laser device of the third embodiment, a buffer layer 202, an n-type contact layer 203, an n-type cladding layer 204, an n-type optical waveguide layer 205, a p-type optical cladding layer 208 and a p-type contact layer 209 are formed successively on the substrate 201 and an n-electrode 211 and a p-electrode 212 are formed on the n-type contact layer 204 and the p-type contact layer 208, respectively.

The substrate 201, the buffer layer 202, the n-type contact layer 203 and the n-type cladding layer 204 are formed in the same manner as in the first and second embodiments. In the third embodiment, an undoped GaN layer may formed between the buffer layer 202 and the n-type contact layer 203, in a like way as in the first and the second embodiment.

The n-type optical waveguide layer 205 constitutes an optical waveguide in conjunction with the active layer 206. Therefore, the n-type optical waveguide layer is formed in such a manner that the refractive index of the n-type optical waveguide layer 205 is not largely different from that of the active layer 206, but is different to a sufficient degree from that of the n-type cladding layer 204.

In the third embodiment, the active layer 206 is formed in the same way as in the first embodiment. However, the present invention is not limited to this configuration and the active layer 206 may be formed in a multi quantum well structure as in the case of the second embodiment. The multi quantum well layer can allow the output to increase.

The p-type optical waveguide layer 205 constitutes an optical waveguide in conjunction with the active layer 206 in a like manner as the n-type optical waveguide layer 105. Therefore, the p-type optical waveguide layer 207 is formed in such a manner that the refractive index of the n-type optical waveguide layer 207 is not largely different from that of the active layer 206, but is different to a sufficient degree from that of the p-type cladding layer 208.

The p-type cladding layer 208 and the p-type contact layer 209 are formed in the same manner as in the first and second embodiments. In the case of the laser, the p-type cladding layer 208 and the p-type contact layer 209 are etched to the vicinity of the boundary surface of the p-type optical waveguide layer 207 to form a ridge geometry with a stripe width of 1.5 $\mu$m (the stripe ridge), with the result that the emission from the active layer 206 focuses under the stripe ridge and the thresholds can be decreased. Particularly, the layers above the p-type cladding layer are preferably in the form of the ridge stripe.

The n-electrode 211 and the p-electrode 212 are formed in the same manner as in the first and second embodiments. Further, an insulting film 230 is formed on the outer surface of the laser.

The nitride semiconductor laser device of the third embodiment which has such a configuration as described above comprises an first barrier layer containing Al on the well layer, as in the case of the first and second embodiments, resulting in the decrease of the thresholds.

Embodiment 4

Figure 13:
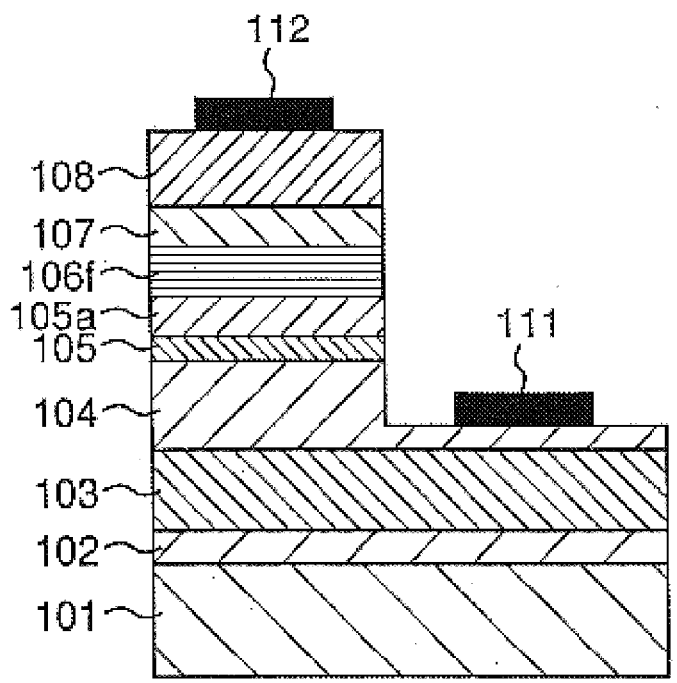
FIG. 13 is a schematic cross sectional view of the configuration of the light emitting diode of the fourth embodiment according to the present invention.

The light emitting device (light emitting diode) of the fourth embodiment according to the present invention has the same configuration as that of the light emitting diode of the first embodiment, as shown in FIG. 13, except that the active layer 106f which will be described bellow in details is provided instead of the active layer and an n-type multi-layered film 105a is further provided between the active layer 106f and the n-type cladding layer 105.

In FIG. 13, elements similar to those of the first embodiment are designates as like number.

Figure 19:
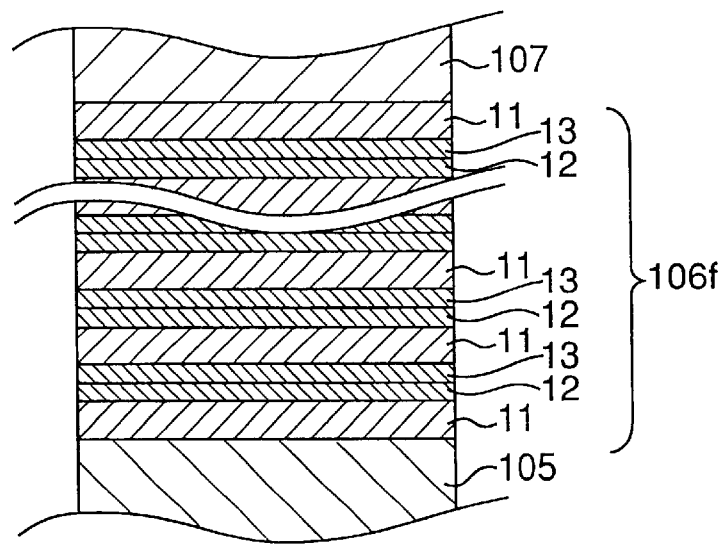
FIG. 19 is a schematic cross sectional view showing the configuration of the active layer of the fourth embodiment according to the present invention.

In the light emitting device of the fourth embodiment, the active layer 106f is constituted, as shown in FIG. 19, by laminating the second barrier layer 11, the well layer 12 and the first barrier layer 13 in this order several times on the n-type multi-layered film 105a and finally, forming the second barrier layer 11 on the topmost layer.

The fourth embodiment is particularly characterized in that the first barrier layer 13 is made of $Al_zGa_{1-z}N$ having a mixing proportion of Al of not less than 0.30 to enhance the effect the first barrier layer 13.

In other words, we found that the higher effect of the first barrier layer 13 is brought to the fore by growing the first barrier layer 13 made of $Al_zGa_{1-z}N$ ($0.30 \leq Z \leq 1$) and then raising the temperature to the growing temperature of the second barrier layer 11 and applied the discovery to the LED device of the fourth embodiment.

We also found that there is a relation between the effect of the first barrier layer 13 and the surface morphology thereof.

Figure 14:
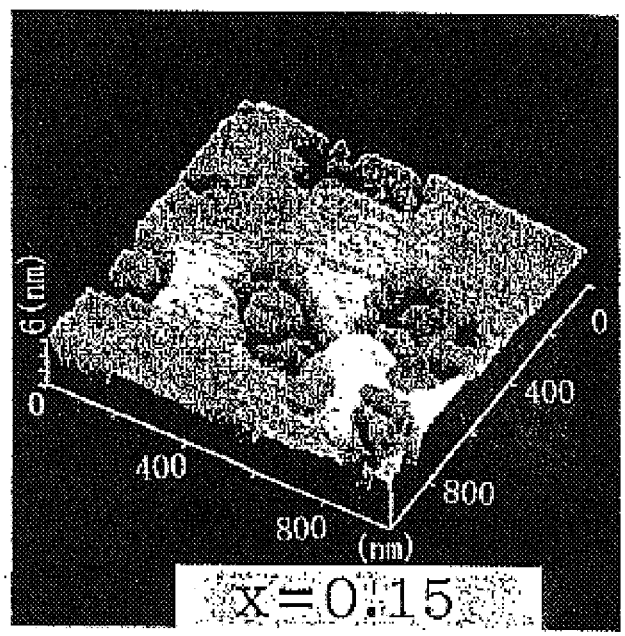
FIG. 14 is a AFM photograph showing the surface morphology of the first barrier layer (in which mixing proportion of Al is 0.15) 13 of the light emitting diode according to the present invention.
Figure 15:
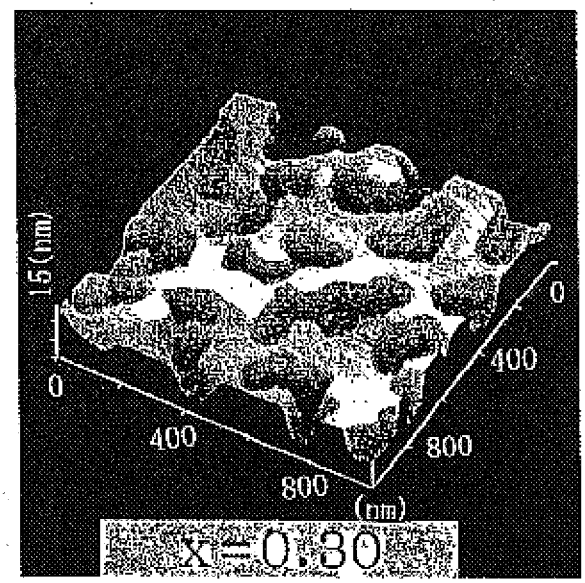
FIG. 15 is a AFM photograph showing the surface morphology of the first barrier layer (in which mixing proportion of Al is 0.30) 13 of the light emitting diode according to the present invention.
Figure 16:
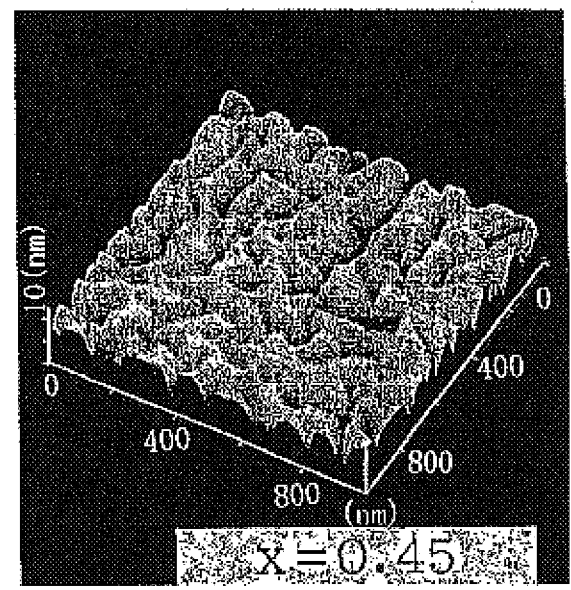
FIG. 16 is a AFM photograph showing the surface morphology of the first barrier layer (in which mixing proportion of Al is 0.45) 13 of the light emitting diode according to the present invention.
Figure 17:
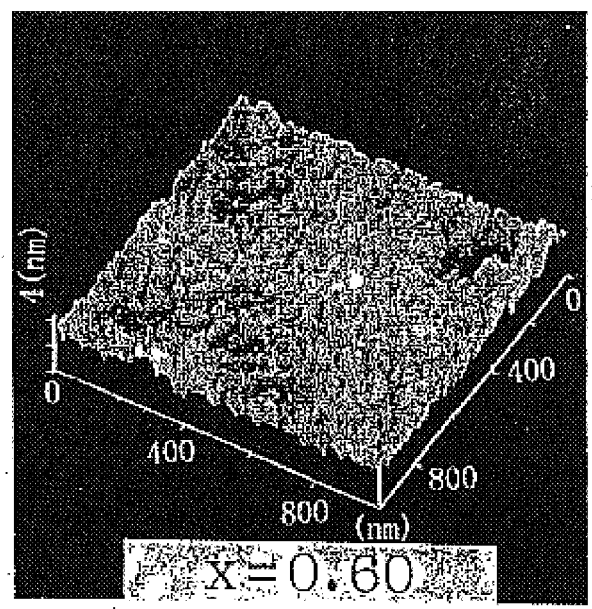
FIG. 17 is a AFM photograph showing the surface morphology of the first barrier layer (in which mixing proportion of Al is 0.60) 13 of the light emitting diode according to the present invention.
Figure 18:
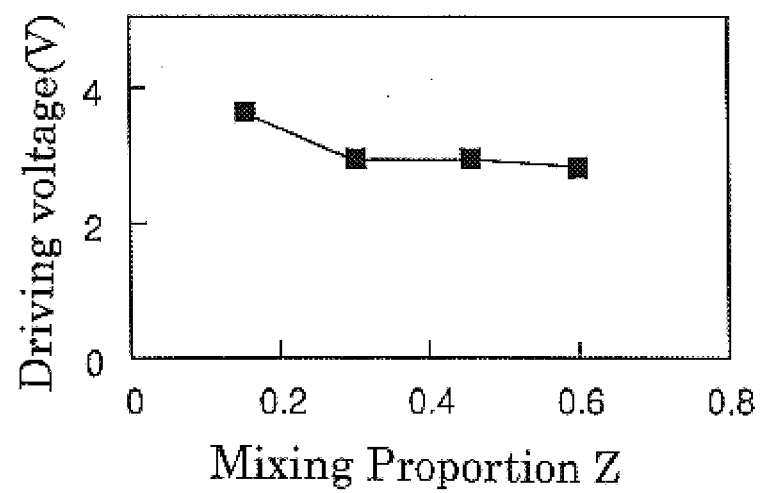
FIG. 18 is a graph showing the driving voltage versus the mixing proportion Z of Al in the light emitting diode according to the present invention.

FIGS. 14 to 17 show the photographs of the surface morphology of the first barrier layer 13 which is obtained by forming the first barrier layer 13 at 820° C. and then, raising the temperature to 1050° C., observed by AFM (atomic force microscope). FIG. 14 shows the photograph of the case that the mixing proportion Z of Al is 0.15, FIG. 15 shows Z=0.30, FIG. 16 shows Z=0.45, and FIG. 16 shows Z=0.60. As shown in figures, when the mixing proportion of Al is not less than 0.30 ($Z \geq 0.30$), the surface of the first barrier layer 13 is in the mesh structure having several regions which cave in or are bored through the layer. The reasons for this are as follows. Since the first barrier layer made of AlGaN is formed at a low temperature, the crystallinity and the thickness of the AlGaN layer is uneven. When the temperature is raised to the temperature for growing the second barrier layer after the formation of the first barrier layer 13, In of the well layer 12 is decomposed in the region of AlGaN which has a bad crystallinity and a small thickness. Thereby, the surface of the first barrier layer 13 caves in or is bored through the layer. Thus, a part of the surface of the well layer 12 is exposed. It was also found that when the mixing proportion Z of Al is not less than 0.30, the regions which cave in or are bored through the layer occupy not less than 10% of the surface of the first barrier layer 13 and the driving voltage is extremely decreased. The results are shown in FIG. 18. FIG. 18 is a graph which shows the change of the driving voltage with the variation of the mixing ratio of Al in the nitride semiconductor LED device according to the present invention.

The preferable thickness of the component layer of the active layer in the fourth embodiment is like to that in the first embodiment.

In the fourth embodiment, the active layer 106f in a multi quantum well structure will be described, but the same effect can be obtained in the case of the active layer 106f is in a single quantum well structure.

Figure 20:
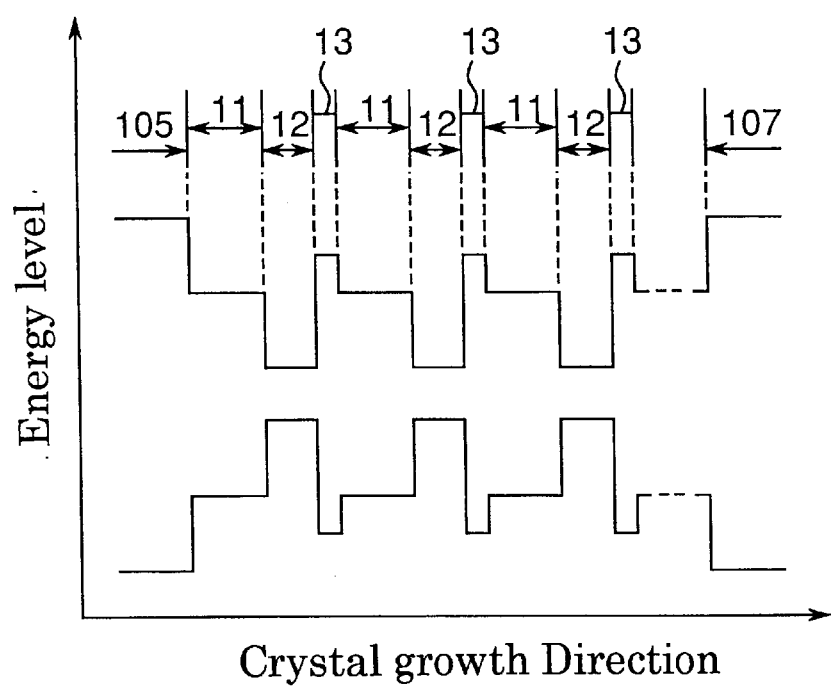
FIG. 20 shows the energy level of the active layer and the regions close to the active layer of the fourth embodiment according to the present invention.
Figure 21:
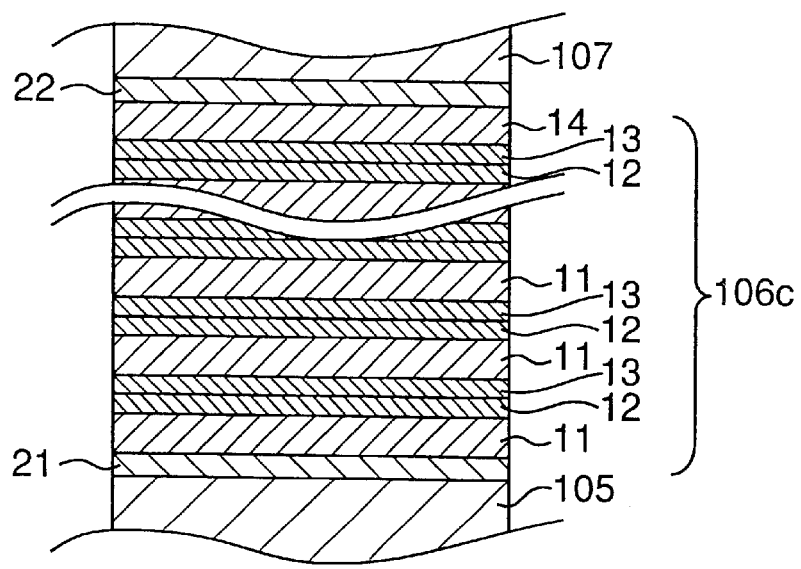
FIG. 21 is a schematic cross sectional view showing the configuration of the active layer of the fifth embodiment according to the present invention.

In the active layer 106f of the fourth embodiment 4, the band gap energy of the first barrier layer 13 is controlled, as shown in FIG. 20, to be higher than that of the second barrier layer 11 and the first barrier layer 13 is surely formed close to the well layer 12 after the formation of the well layer 12.

In the fourth embodiment, the first barrier layer 13 is formed on every well layer 12 as a most preferable example. But the present invention is not limited to this configuration and it is essential only that a first barrier layer 13 is formed at least one among the places between the well layer 12 and the second barrier layer 11.

The thickness of the first barrier layer 13 is smaller than that of the second barrier layer 11 and is preferably a monoatomic layer or longer and not more than 100 angstroms. If the thickness is beyond 100 angstroms, a miniband is formed between the first barrier layer 13 and the well layer 12, resulting in the deterioration of the luminous efficiency. Therefore, the thickness of the first barrier layer 13 is desirably as small as possible.

The thickness of the second barrier layer 11 can be controlled within the range from 10 angstroms to 400 angstroms. The thickness of the well layer 12 is preferably controlled within the range from 10 angstroms to 70 angstroms.

In the fourth embodiment, the second cladding layer 105a, a multi-layered film, is, for example, an undoped layer in the super lattice structure constructed of the undoped GaN layer and the undoped InGaN layer, which is formed for the purpose of enhancing the emission output.

The n-type cladding layer 105 is formed in the same manner as in the first embodiment to increase the withstand static voltage.

Thus, in the fourth embodiment, the n-side cladding layer is constructed of the n-type cladding layer 105 and the second cladding layer 105a, a multi-layered film to increase the emission output and the withstand static voltage.

As described above, in the light emitting diode of the fourth embodiment, there is provided a first barrier layer containing Al in the relatively large amount which has a band gap energy higher than that of the second barrier layer to decrease the driving voltage. And the n-side cladding layer is constructed of the n-type cladding layer 105 and the second cladding layer 105a to increase the emission output and the withstand static voltage.

The forth embodiment has been described with reference to the nitride semiconductor LED device, but the present invention is not limited to the LED device. Even when the present invention is applied to the nitride semiconductor laser device, the similar effect can be achieved.

Embodiment 5

Next, the light emitting diode of the fifth embodiment according to the present invention will be described.

The light emitting diode of the fifth embodiment is fabricated in the same manner as the light emitting diode of the second embodiment, except that an n-side second cladding layer 21 made of nitride semiconductor containing In is formed between the n-type cladding layer 105 and the active layer 106c, and a p-side second cladding layer 22 made of nitride semiconductor containing In is formed between the p-type cladding layer 105 and the active layer 106c.

In the fifth embodiment, the n-side second cladding layer 21 and the p-side second cladding layer 22 are formed on each side of the active layer 106c to prevent the deterioration of the crystallinity and the occurrence of the undesirable strains in the active layer 106c resulting from the lattice constant mismatch between the n-type cladding layer 105 and the p-type cladding layer 107.

Therefore, the n-side second cladding layer 21 and the p-side second cladding layer 22 are effective particularly in the case that the lattice constant of the n-type cladding layer 105 is largely different from that of the p-type cladding layer 107 and the active layer containing In in the relatively large amount is formed.

To be more specific, the n-side second cladding layer 21 functions in such a manner that the well layer 12 is formed with In being dispersed evenly, with the result that the variation of the composition of the well layer can be decreased. This configuration can prevent the decrease of the emission output of the light emitting device which comprises an active layer including an well layer of highly mixed crystal which contains In in a relatively large amount. This effect is brought to the fore, particularly in the case that the active layer 106c in a multi quantum well structure in which the well layer 12 of relatively highly mixed crystal containing relatively high proportion of In must be formed repeatedly is grown.

The n-side second cladding layer 21 may be made of nitride semiconductor containing In represented by the general formula $In_{X6}Ga_{1-X6}N$, The above-mentioned effect can be exerted better by setting the X6 within a range from 0.0025 to 0.1 and setting the thickness within a range from 1000 Å to 5000 Å.

The p-side second cladding layer 22 acts to relax the undesirable strain in the well layer of the active layer which occurs at the time when the p-type cladding layer 107 is formed on the active layer 106c and which results from the lattice constant mismatch between the active layer 106c and the p-type cladding layer 107. This action can, particularly, prevent the decrease of the emission output of the light emitting device which comprises an active layer including an well layer of highly mixed crystal containing In in a relatively large amount. This effect is brought to the fore, particularly in the case that the active layer 106c in a multi quantum well structure in which the well layer 12 of relatively highly mixed crystal containing relatively high proportion of In must be formed repeatedly is grown.

The p-side second cladding layer 21 may be made of nitride semiconductor containing In represented by the general formula $In_{X7}Ga_{1-X7}N$. The above-mentioned effect can be exerted better by setting the X7 within a range from 0.005 to 0.1 and setting the thickness within a range from 100 Å to 1000 Å.

Figure 23:
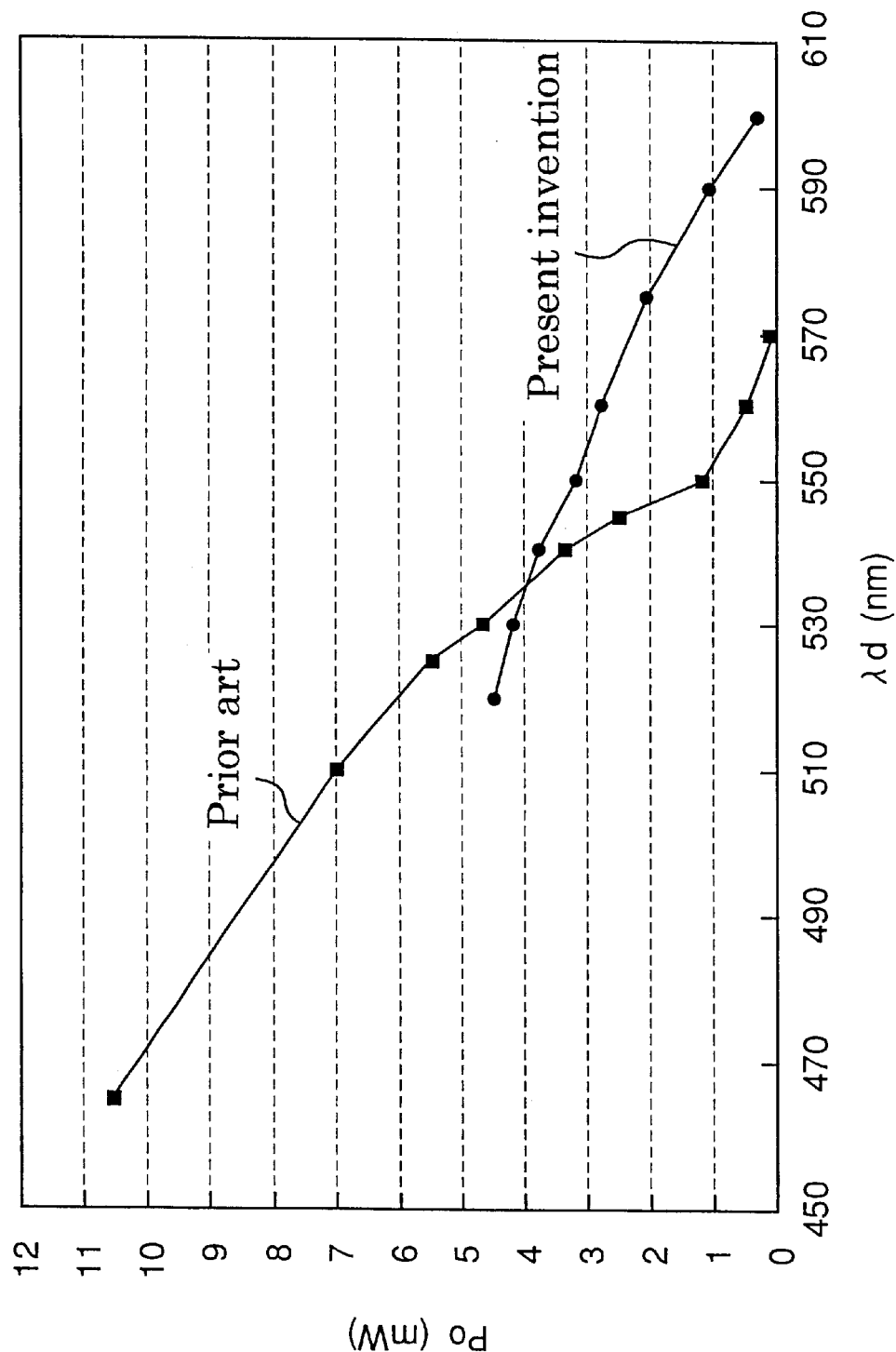
FIG. 23 is a graph showing the relation between the emission output and the wavelength in the light emitting diode of the fifth embodiment according to the present invention.

FIG. 23 is a graph showing the emission output Po (mW) versus the wavelength λd (nm) of the light emitting diode of the fifth embodiment according to the present invention, compared to the conventional light emitting diode.

As shown in the graph of FIG. 23, the configuration of the fifth embodiment can prevent the decrease of the emission output in the wavelength range of not less than 535 nm.

An assessment was made of the light emitting diode of the present invention and the conventional light emitting diode which had below-mentioned configurations, respectively.

The light emitting diode of the present invention has such a configuration that comprises:

(1) buffer layer 102; undoped $Al_xGa_{1-x}N$, 100 angstroms,
(2) undoped GaN layer 103; GaN, 1.5 μm,
(3) n-type contact layer 104; Si doped GaN, 4.165 μm
(4) n-type cladding layer 105; three layered structure constructed of undoped GaN (3000 angstroms)/Si doped GaN (300 angstroms)/undoped GaN (50 angstroms),
(5) n-side second cladding layer ; $In_{0.005}G_{0.995}N$, 3500 angstroms,
(6) active layer 106c; (a second barrier layer made of GaN, 70 angstroms/an well layer made of InGaN, 30 angstroms/a first barrier layer made of AlGaN, 40 angstroms)×4 cycle+an uppermost layer made of GaN, 70 angstroms,
(7) p-side second cladding layer 22; Mg doped $In_{0.014}Ga_{0.986}N$, 200 angstroms,
(8) p-type cladding layer 107; undoped $Al_{0.042}Ga_{0.958}N$, 2500 angstroms, and
(9) p-type contact layer 108; Mg doped GaN, 1200 angstroms.

The conventional light emitting diode has such a configuration that comprises:
(1) buffer layer; undoped $Al_xGa_{1-x}N$, 100 angstroms,
(2) undoped GaN layer; GaN, 1.5 μm,
(3) n-type contact layer; Si doped GaN, 4.165 μm
(4) n-type cladding layer; three layered structure constructed of undoped GaN (3000 angstroms)/Si doped GaN (300 angstroms)/undoped GaN (50 angstroms),
(5) buffer super lattice layer; (GaN, 40 angstrom/$In_{0.13}Ga_{0.87}N$, 20 angstroms)×10+GaN, 40 angstroms,
(6) active layer 106c; (a barrier layer made of GaN, 200 angstroms/an well layer made of InGaN, 30 angstroms)×4 cycle+a barrier layer made of GaN, 200 angstroms,
(7) p-side cladding layer; Mg doped $Al_{0.16}Ga_{0.84}N$, 40 angstroms/Mg doped $In_{0.03}Ga_{0.97}N$, 25 angstroms)×5+ Mg doped $Al_{0.16}Ga_{0.84}N$, 40 angstroms,
(8) undoped AlGaN; undoped $Al_{0.05}Ga_{0.95}N$, 2800 angstroms, and
(9) p-type contact layer; Mg doped GaN, 1200 angstroms.

Figure 22:
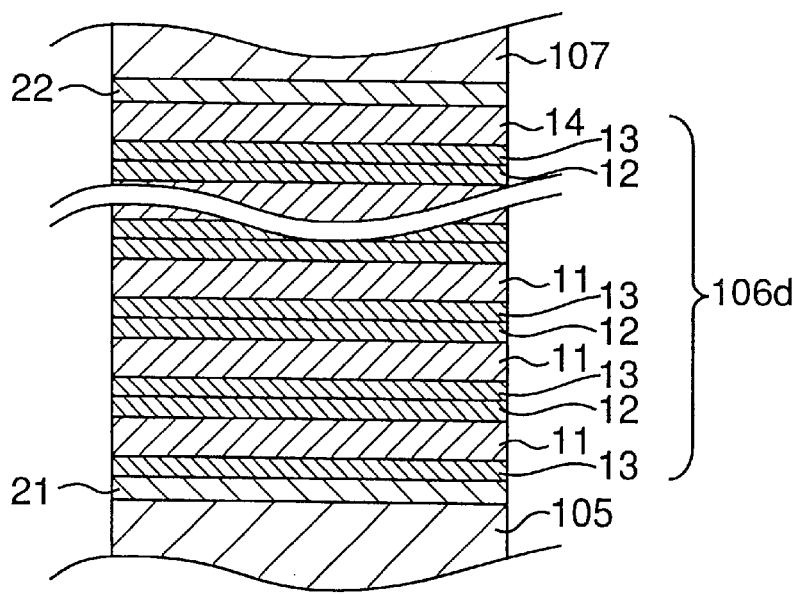
FIG. 22 is a schematic cross sectional view showing the configuration of the active layer of a modified example of the fifth embodiment according to the present invention.

In the light emitting diode of the fifth embodiment, the active layer 106c is formed in such a way that a second barrier layer is first formed on the n-side second cladding layer 21. But, according to the present invention, as shown in FIG. 22, the active layer 106c may be formed in such a way that a first barrier layer is first formed on the n-side second cladding layer 21.

The same effect can be achieved in the above-mentioned configuration, like in the fifth embodiment.

EXAMPLES

The examples of the present invention will be described below.

To make sure, the present invention is not limited to the examples.

Example 1

The device of Example 1 is fabricated in the following manner. The C-plane sapphire substrate is used as a substrate 101. The component layer is grown using a metal-organic chemical vapor deposition (MOCVD) method. Trimethylgallium (TMG), triethylgallium (TEG), trimethylindium (TMI) and trimethylaluminum (TMA) is used as a source of III-group element, Ga, In and Al, respectively. Ammonia ($NH_3$)is used as a source of V-group element, N. Monosilane ($SiH_4$) is used as a source of an n-type dopant and bicyclopentadienyl magnesium ($Cp_2Mg$) as a source of a p-type dopant, respectively. $H_2$ and $N_2$ are used as a carrier gas and a flowing gas.

First, an auxiliary substrate 101 made of sapphire is set in the MOCVD device and the temperature of the substrate 101 is increased to 1140° C. in $H_2$ to treat the surface of the substrate 101.

After the surface treatment of the substrate, the temperature of the substrate 101 is decreased to 510° C. A buffer layer 102 made of GaN having a thickness of about 200 angstroms is grown on the substrate 101 using TMG (trimethylgallium) and ammonia as a source of GaN.

After growing the buffer layer 102, the temperature of the substrate is increased to 1150° C. Using TMG and ammonia as a source of GaN, an undoped GaN layer 103 is grown to the thickness of 1.5 μm on the buffer layer.

Further, after forming an undoped GaN layer 103, Using TMG and ammonia as a source of GaN and $SiH_4$ as a source of Si of the dopant, an n-type contact layer 104 made of GaN doped with Si to $5 \times 10^{18}/cm^3$ is grown to the thickness of about 2 μm.

Next, an n-type cladding layer 105 is formed on the n-type contact layer 104. The n-type cladding layer 105 is constructed of a n-type cladding fist layer, a second layer and a third layer. An undoped GaN layer is formed as an n-type cladding first layer and a third layer using TMG and $NH_3$ as a source of GaN. A GaN layer doped with Si to $5 \times 10^{18}/cm^3$ is formed as an n-type cladding second layer using $SiH_4$ as a source of Si of the dopant. The thickness of the n-type cladding first layer, second layer and third layer is 3000 angstroms, 300 angstroms and 50 angstroms, respectively.

Next, the temperature of the substrate is decreased to 1000° C., and TEG in the amount of 40 cc/min and $NH_3$ in the amount of about 3 l/min are supplied instead of TMG. Thus, a second barrier layer 11 made of undoped GaN having a thickness of 50 angstroms is formed on the n-type contact layer 104. In the case that the second barrier layer is made of ternary mixed crystal of $In_{x3}Ga_{1-x3}N$, TMA in an appropriate amount is further supplied.

Next, the temperature is decreased to 750° C. TEG in the amount of 4.5 cc/min, $NH_3$ in the amount of about 3 l/min and TMI in the amount of 40 cc/min are supplied. Thus, an well layer 12 made of $In_{0.75}Ga_{0.25}N$ having a thickness of 35 angstroms is formed on the second barrier layer 11.

And then, the temperature of the substrate is increased to 800° C. and a first barrier layer 13 is formed. TEG in the amount of 18 cc/min, $NH_3$ in the amount of about 3 l/min and TMA in the amount of 4.5 cc/min are supplied. Thus, a first barrier layer 13 made of $Al_{0.2}Ga_{0.8}N$ having a thickness of 30 angstroms is formed on the well layer 12.

The process for growing the above-mentioned first barrier layer 11, well layer 12 and first barrier layer 13 are repeated four times. And finally, the temperature of the substrate is increased to 1000° C. and TEG in the amount of 40 cc/min and $NH_3$ in the amount of about 3 l/min are supplied. Thereby, an uppermost layer 14 made of undoped GaN having a thickness of about 50 angstroms is formed on the topmost first barrier layer 13. Thus, the active layer 106 in the multi quantum well structure is formed.

Next, after forming the uppermost layer 14, at the same temperature, a p-type cladding layer 197 made of Mg doped $Al_{0.1}Ga_{0.9}N$ having a thickness of about 200 angstroms is formed on the active layer 106 using TEG, $NH_3$ and TMA as a reactive gas and $CP_2Mg$ as a dopant source.

Next, the temperature is decreased to 950° C. and a p-type contact first layer 197 made of undoped GaN having a thickness of about 1300 angstroms is formed on the cladding layer using TEG and $NH_3$ as a reactive gas.

Further, $CP_2Mg$ is added as a dopant source to form a p-type contact second layer made of Mg doped GaN having a thickness of about 200 angstroms on the p-type contact first layer.

Then, the inside of the reactor is replaced with $N_2$ and at 600° C., the heat annealing is conducted for 5 minutes. The heat annealing allows the p-type cladding layer 107 and p-type contact layer 108 to be transformed into the p-type layer having a high carrier concentration.

Next, the etching is conducted until the n-type contact layer 104 is exposed, in order to form the n-electrode 111. An n-electrode 111 and a p-electrode 112 are formed in the predetermined place on the wafer, respectively.

The yellow light emitting diode as fabricated in this way comprises an well layer 106 made of $In_{0.75}Ga_{0.25}N$ showed the results of emission peak wavelength λd of 590 nm, half width of 45 nm, emission output of 1.8 mW and driving voltage of 3.2 V under a forward current (If) of 20 mA.

Example 2

The light emitting diode of Example 2 is fabricated in the same way as in Example 1 except that the active layer is formed in the following manner.

According to Example 2, after forming an n-type cladding layer 105, the temperature of the substrate is decreased to 1000° C. and TEG in the amount of 40 cc/min and $NH_3$ in the amount of about 3 l/min are supplied instead of TMG. Thus, a second barrier layer 11 made of undoped GaN having a thickness of 50 angstroms is formed on the n-type contact layer 104.

Next, the temperature of the substrate is decreased to 750° C. and TEG in the amount of 4.5 cc/min, $NH_3$ in the amount of about 3 l/min and further, TMI in the amount of 40 cc/min are supplied. Thus, an well layer 12 made of $In_{0.75}Ga_{0.25}N$ having a thickness of about 35 angstroms is formed on the second barrier layer 11.

And the temperature of the substrate is increased to 800° C. to form a first barrier layer 13. TEG in the amount of 18 cc/min, $NH_3$, in the amount of about 3 l/min and further, TMA in the amount of 4.5 cc/min are supplied. Thus, a first barrier layer 13 made of $Al_{0.2}Ga_{0.8}N$ having a thickness of about 30 angstroms is formed on the well layer 12.

Thereafter, the temperature of the substrate is increased to 1000° C. and TEG in the amount of 40 cc/min and $NH_3$ in the amount of about 3 l/min are supplied. Thereby, an uppermost layer 14 made of undoped GaN having a thickness of about 50 angstroms is formed on the first barrier layer 13. Thus, the active layer 106 in a single well quantum structure is formed.

After forming the uppermost layer 14, the p-type cladding layer and the layers above the p-type cladding layer 107 are formed sequentially in the same manner as in Example 1.

The light emitting diode of Example 2 fabricated in the above-mentioned way showed the similar results to those in Example 1.

Figure 9:
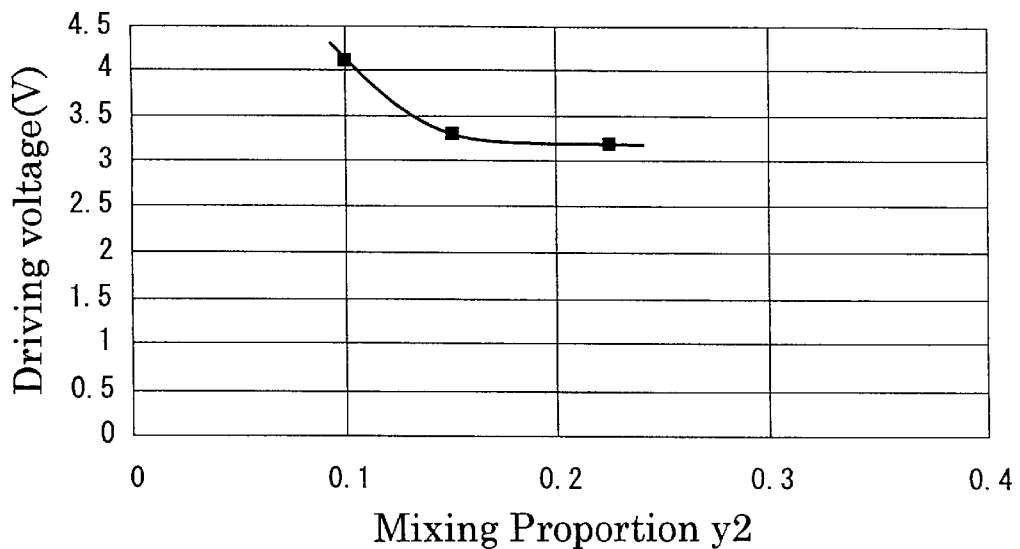
FIG. 9 is a graph showing the relation between the driving voltage and the mixing proportion, y2 of Al of the first barrier layer, in the light emitting diode according to the present invention.

Next, the light emitting diode of Example 1 having a multi quantum well structure will described in which the first barrier layer is made of $Al_{y2}Ga_{1-y2}N$ with a mixing proportion of Al being varied successively. FIG. 9 shows the relationship between the driving voltage and the mixing proportion, y2. The driving voltage as described herein means a driving voltage required to drive the light emitting diode under the forward current If=20 mA. As shown in the drawing, the voltage required to drive the light emitting device under the forward current of 20 mA tends to decrease in the region of y2<0.15 and becomes almost constant in the region of y2≧0.15. This indicates that the effect of the increase of the mixing proportion of Al in the first barrier layer on the decrease of the driving voltage reaches the saturation point in the region of y2≧0.15.

Figure 10:
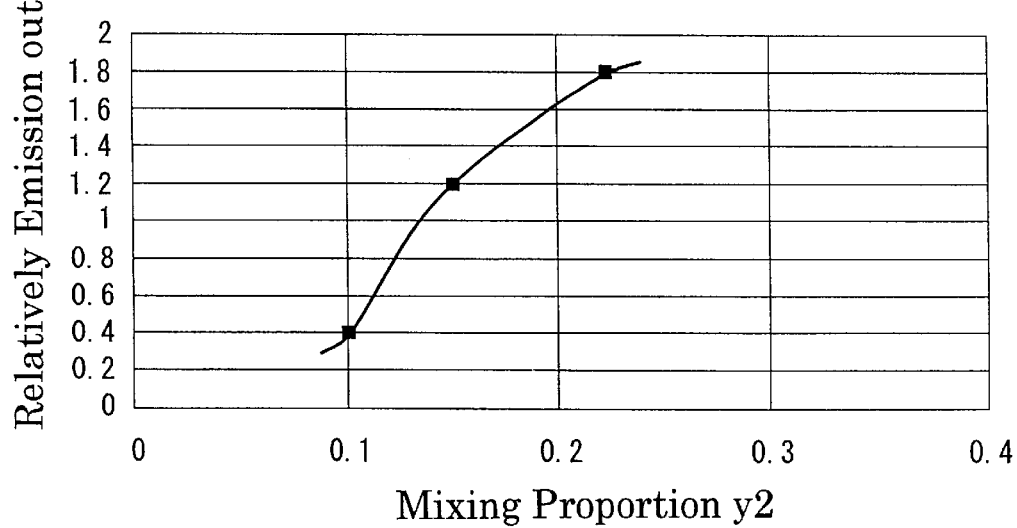
FIG. 10 is a graph showing the relation between the emission output and the mixing proportion, y2 of Al of the first barrier layer, in the light emitting diode according to the present invention.

Next, FIG. 10 shows the emission output versus the mixing proportion y2 of Al of the light emitting diode of Example 1 having a multi quantum well structure in which the first barrier layer is made of $Al_{y2}Ga_{1-y2}N$. As shown in the drawing, the emission output is enhanced extremely in the region of y2≧0.1.

Generally, the difference ΔE of the band gap energy (=Eg1−Eg2) required to confine the carrier in the laser diode having a double-hetero structure made AlGaAs and InGaAsP is ΔE≧0.3 eV. (Hiroo Yonezu, optical communication device engineering—light emitting device and light receiving device, pp.72, 1.8–1.14, Kougakutosho co. publication.

The Japanese Patent Laid-Open Publication No. Hei6-164055 discloses that the semiconductor layer comprising an well layer and a barrier layer made of $In_xAl_yGa_{1-x-y}N$ (0≦x, 0≦y, x+y≦1) preferably the difference ΔE of the band gap energy between them of not less than 0.3 eV.

The difference of the band gap energy ΔE of the light emitting diode of the present invention made of $In_xAl_yGa_{1-x-y}N$ is estimated roughly using the following approximation expression:

$Eg=3.4-1.45x+2.8y(eV)$

In the case that the second barrier layer 11 is made of GaN and the well layer is made of $In_{0.75}Ga_{0.25}N$, ΔE is about 1.1 eV. Further, the well layer 12 is made of $In_{0.75}Ga_{0.25}N$ and the first barrier layer 13 is made of $Al_{0.2}Ga_{0.8}N$, ΔE is about 1.6 eV.

The carrier confinement in the laser diode needs to be conducted at higher density than that in the light emitting diode. ΔE required for the laser diode is higher than that for the light emitting diode. Considering the above-mentioned facts, the second and first barrier layers 11, 13 in the light emitting diode according to the present invention has an extremely large band gap energy difference from the well layer 12, compared to the general barrier layer.

ΔEg between the first barrier layer 13 and the well layer 12 is minimal in the case that the mixing proportion y2 of Al in the first barrier layer 13 and the mixing proportion x1 of In in the well layer 12 are small. Even when y2 is 0.1, the lower limit for having a large effect on the enhancement of emission output and x1 is 0.6, the lower limit for obtaining a preferable yellow emission wavelength, ΔEg is about 1.2 eV, which is still extremely large. Further, even when y2 is 0.15, the lower limit for having an effect on the decrease of the threshold voltage and x1 is 0.6, the lower limit for obtaining a preferable yellow emission wavelength, ΔEg is about 1.3 eV, which is a larger value.

Figure 11:
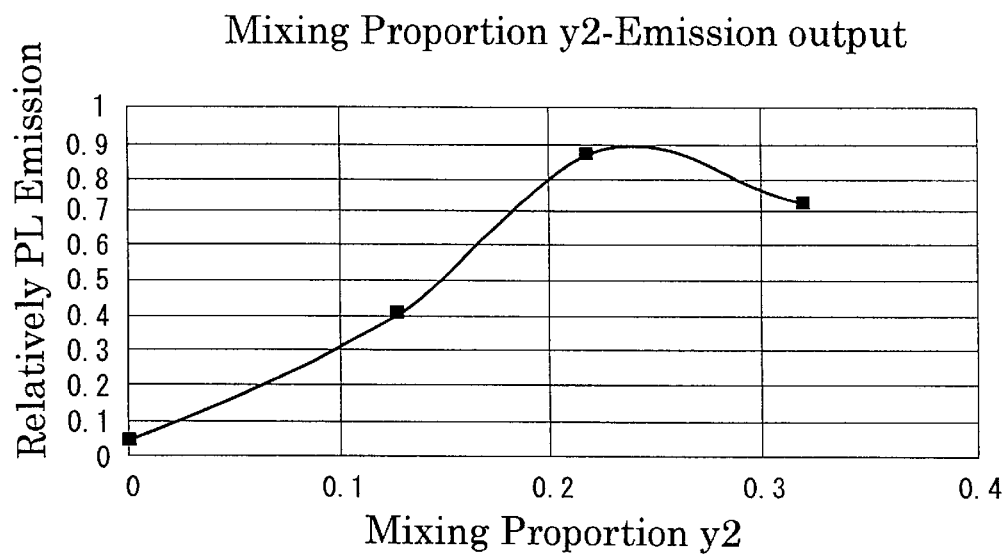
FIG. 11 is a graph showing relation between the PL emission output and the mixing proportion, y2 of Al of the first barrier layer, in the light emitting diode according to the present invention, in the intermediate state of the device.

When the first barrier layer having a large mixing proportion, y2 of Al is formed on the well layer 12 having a large mixing proportion, x1 of In, the emission output of the light emitting diode can be enhanced extremely. The reason for this is considered to lie in the exceedingly large difference in the band gap energy between the well layer and the barrier layer. Then, we conducted PL evaluation using a device in the intermediate state with no p-type semiconductor layer, which had an active layer 106 composed of one second barrier layer 11, one well layer 12 and one first barrier layer, in order to assess the device eliminating various other factors. As shown in FIG. 11, the PL emission output versus the mixing proportion of Al in the first barrier layer was enhanced in the region of y2 being not less than about 0.12. It is supposed from this fact that the effect of enhancing the emission output of the light emitting diode comprising nitride semiconductor layers which emits the light having a wavelength in the yellow region is achieved mainly by forming the first barrier layer having a large mixing proportion, y2 of Al on the well layer. In other words, the above-mentioned effect is ascribable to an exceedingly large difference in the band gap energy between the well layer and the barrier layer in the active layer.

Further, in the aforementioned Japanese Patent Laid-Open Publication No. Hei6-164055, it is described that the difference in lattice constant between the well layer and the barrier layer of the semiconductor laser which comprises the well layer and the barrier layer made of $In_xAl_yGa_{1-x-y}N$ ($0 \leq x$, $0 \leq y$, $x+y \leq 1$) is preferably not more than 1%. On the other hand, the well layer made of $In_{0.6}Ga_{0.4}N$ and the first barrier layer made of $Al_{0.1}Ga_{0.9}N$ have a lattice constant of 3.402 angstroms and 3.181 angstroms, respectively and the ratio of the difference in lattice constant between both layers to the lattice constant of the well layer is about 6.5%. The ratio is much larger than the difference in lattice constant of 1%, which is a preferable value in the Japanese Patent Laid-Open Publication No. Hei6-164055. The well layer made of $In_{0.6}Ga_{0.4}N$ and the first barrier layer made of $Al_{0.2}Ga_{0.8}N$ have a lattice constant of 3.402 angstroms and 3.174 angstroms, respectively and the ratio of the difference in lattice constant is about, 6.7%, which is further larger.

However, the inventors found that the second barrier layer of the present invention can improve the crystallinity of the well layer which is formed on the second barrier layer and the first barrier layer having a lattice constant which is largely different from that of the well layer and has a good crystallinity can be formed on the well layer. Further, the second barrier layer is formed one more time on the first barrier layer, with the result that a multi quantum well structure can be formed without the deterioration of the crystallinity. From another viewpoint, the present invention may be based on the effect of the lattice mismatch resulting from the large difference in lattice constant between the well layer and the first barrier layer.

Figure 12:
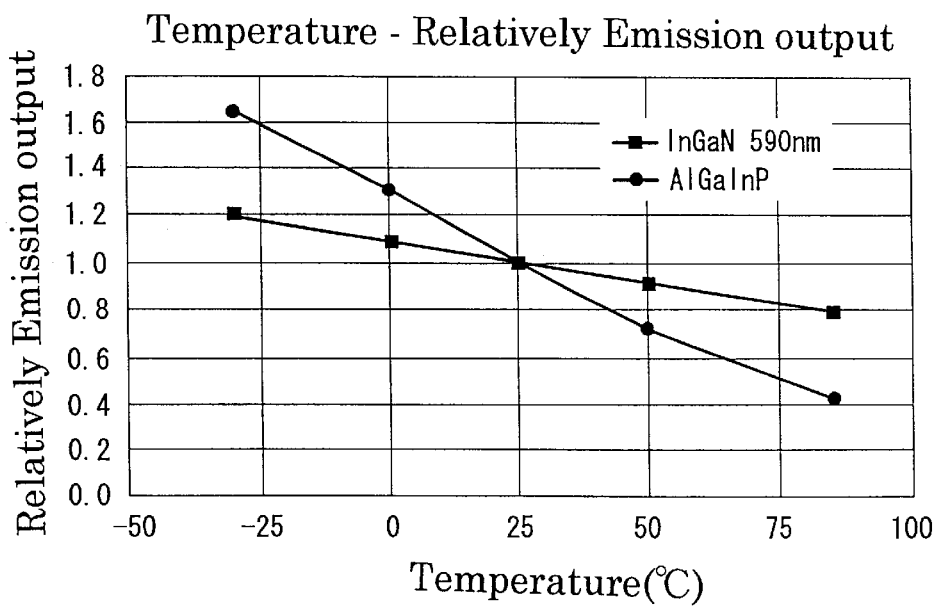
FIG. 12 is a graph showing the temperature characteristics of the light emitting diode according to the present invention, compared to those of the conventional light emitting diode made of AlGaIn.

Next, FIG. 12 shows the comparison in the temperature characteristics between the light emitting diode of the present invention which comprises nitride semiconductor layers and emits light in the yellow region and the conventional light emitting diode made of AlGaInP. The light emitting diode comprising nitride semiconductor layers in FIG. 12 is an example of the light emitting diode of this example, which has an active layer 106 in a multi quantum well structure comprising a second barrier layer 11 made of undoped GaN, an well layer made of $In_{0.75}Ga_{0.25}N$ and a first barrier layer 13 made of $Al_{0.2}Ga_{0.8}N$. The temperature characteristics in FIG. 12 is represented as an emission output under the driving current If=20 mA. As shown in the drawing, the deterioration of the emission output at an elevated temperature in the light emitting diode of the present invention made of nitride semiconductor is smaller than that in the conventional light emitting diode made of AlGaInP.

When the indicator such as a traffic signal constructed of light emitting diodes is used outdoors, the light emitting diode need to have a large emission output, in term of an visual identification, in the situation of the solar radiation being very strong. Generally, since the temperature within the indicator is very high in summer when the solar radiation is very strong or in the regions such as tropic zones, the indicator which is used outdoors is preferably constructed of light emitting devices of which the decrease of the emission output is small at an elevated temperature. When the indicator is used outdoors, the temperature inside the indicator often reaches 75° C. The emission output at 75° C. of the light emitting diode made of AlGaInP decreases by about 50%, compared to at room temperature, 25° C. The emission output at 75° C. of the nitride semiconductor light emitting diode according to the present invention maintains about not less than 80%, compared to at 25° C. Thus, the present invention can prevent the decrease of the emission output.

Thus, the nitride semiconductor light emitting device according to the present invention which emits yellow light has more excellent temperature characteristics, compared to the light emitting diode made of AlGaInP which emits yellow light.

Example 3

FIG. 13 is a schematic sectional view showing the structure of the nitride semiconductor LED device according to one example of the present invention. Example 3 will be described with reference to FIG. 3. The structure of the light emitting device according to the present invention in not limited to that of FIG. 13.

(Buffer Layer 202)

The GaN substrate 101 (which may be a sapphire substrate) which has been formed using a widely known method on the substrate made of C-face sapphire of two-inch φ is set in the MOVPE reactor. A buffer layer 102 made of GaN which has a thickness of about 200 angstroms is grown using TMG and ammonia on the GaN substrate 101.
(Undoped GaN Layer 103)

After growing the buffer layer, TMG is stopped and the temperature is increased to 1050° C. At to 1050° C., using ammonia and TMG as a source of GaN, an undoped GaN layer 103 is grown to the thickness of 1 μm.
(n-type Contact Layer 104)

Subsequently, at 1050° C., using TMG and ammonia as a source of GaN and silane gas as an impurity gas, an n-type contact layer 104 made of GaN doped with Si to $3\times10^{19}/cm^3$ is grown to the thickness of 4 μm.
(n-type Cladding Layer 105)

Next, only silane gas is stopped. At 1050° C., a first layer made of undoped GaN is grown to the thickness of 3000 angstroms using TMG and ammonia. Subsequently, at the same temperature, the silane gas is added. A second layer made of GaN doped with Si to $4.5\times10^{18}/cm^3$ is grown to the thickness of 300 angstroms. Further, subsequently, only silane gas is stopped and at the same temperature, a third layer made of undoped GaN is grown to the thickness of 50 angstroms. Thus, an n-type cladding layer 105 in the three-layered structure having a total thickness of 3350 angstroms is formed.
(n-type Multi-layered Film 105a)
(n-side Optical Waveguide Layer 8)

Next, at the same temperature, a second nitride semiconductor layer made of undoped GaN is grown to the thickness of 40 angstroms. And then, the temperature is decreased to 800° C. and a first nitride semiconductor layer made of undoped $In_{0.13}Ga_{0.87}N$ is grown to the thickness of 20 angstroms using TMG, TMI and ammonia. These operations are repeated and the first and second layers are laminated alternately in the order of the second layer+the first layer, in 10 layers each. And finally, the second nitride semiconductor layer made of GaN is grown to the thickness of 40 angstroms. Thus, the n-type multi-layered film 105a in a super lattice structure having a total thickness of 640 angstroms is formed.
(Active Layer 106f)

Next, at 1050° C., a second barrier layer 11 made of $In_{0.1}Ga_{0.9}N$ doped with Si to $5\times1^{17}/cm^3$ is grown to the thickness of 200 angstroms using TMG, TMI, ammonia and silane gas. Subsequently, at 820° C., a well layer 12 made of $In_{0.3}Ga_{0.7}N$ is grown to the thickness of 30 angstroms using TMG, TMI and ammonia. Further, a first barrier layer 13 made of undoped $Al_{0.3}Ga_{0.7}N$ is grown to the thickness of 10 angstroms using TMG, TMA and ammonia. This three-layered structure constructed of the second barrier layer 11, the well layer 12 and the first barrier layer 13 is laminated four more times and finally, the second barrier layer 11 is formed. Thus, the active layer 106f in a multi quantum well (MQW) structure having a total thickness of 1400 angstroms is formed.
(p-type Cladding Layer 107)

Subsequently, at 1050° C., a third nitride semiconductor layer made of p-type $Al_{0.2}Ga_{0.8}N$ doped with Mg to $5\times10^{19}/cm^3$ is grown to the thickness of 40 angstroms using TMG, TMA, ammonia and Cp2Mg (cyclopentadienyl magnesium). Subsequently, at 800° C., a fourth nitride semiconductor layer made of $In_{0.2}Ga_{0.98}N$ doped with Mg to $5\times10^{19}/cm^3$ is grown to the thickness of 25 angstroms using TMG, TMI, ammonia and Cp2Mg. These operations are repeated and the third and fourth layers are laminated alternately in the order of the third layer+the fourth layer, in 5 layers each. And finally, the third nitride semiconductor layer is grown to the thickness of 40 angstroms. Thus, the p-type cladding layer, a multi-layered film 107 in a super lattice structure having a total thickness of 365 angstroms is formed.
(p-type Contact Layer 105)

Subsequently, at 1050° C., a p-type contact layer 108 made of p-type GaN doped with Mg to $1\times10^{20}/cm^3$ is grown to the thickness of 700 angstroms using TMG, ammonia and Cp2Mg.

After the reaction is completed, the temperature is decreased to room temperature. Additionally, the annealing is performed to the wafer at 700° C. in nitrogen atmosphere within the reactor, so as to make the p-type layer less resistive. After annealing, the wafer is removed out of the reactor. A mask having a predetermined shape is formed on the surface of the topmost p-type contact layer 108. The etching is conducted from the p-type contact layer side with RIE (reactive ion etching) apparatus to expose the surface of the n-type contact layer 104, as shown in FIG. 13.

After etching, a translucent p-side electrode including Ni and Au and having a thickness of 200 angstroms is formed on the almost entire surface of the topmost p-type contact layer 108, and an n-side electrode 21 including W and Al on the surface of the n-type contact layer 104 which has been exposed by etching, resulting in a LED device.

The resulting LED device showed a blue emission of 470 nm and a driving voltage of 3.0 V under the forward current of 20 mA. The surface morphology of the first barrier layer during a temperature rise up to the growing temperature of the barrier layer is shown in FIG. 15.

Comparative Example 1

The LED device was fabricated in which the active layer was formed in the following manner, so as to compare with Example 1.
(Active Layer)

At 1050° C., a barrier layer made of $In_{0.1}Ga_{0.9}N$ doped with Si to $5\times10^{17}/cm^3$ is grown to the thickness of 200 angstroms using TMG, TMI, ammonia and silane gas. Subsequently, at 820° C., a well layer made of $In_{0.3}Ga_{0.7}N$ is grown to the thickness of 30 angstroms using TMG, TMI and ammonia. Further, the barrier layer and well layer are laminated four times and finally, the barrier layer 11 is formed. Thus, the active layer 106 in a multi quantum well (MQW) structure having a total thickness of 1350 angstroms is formed.

Other constructions are the same as those in Example 3 except that the active layer is formed in the above-mentioned manner. The resulting device showed the broad emission peak and a driving voltage of 3.8 V.

Comparative Example 2

The LED device was fabricated in which the active layer was formed in the following manner, so as to compare with Example 1.
(Active Layer)

At 1050° C., a barrier layer made of $In_{0.1}Ga_{0.9}N$ doped with Si to $5\times10^{17}/cm^3$ is grown to the thickness of 200 angstroms using TMG, TMI, ammonia and silane gas. Subsequently, at 820° C., a well layer made of $In_{0.3}Ga_{0.7}N$ is grown to the thickness of 30 angstroms using TMG, TMI and ammonia. Further, a first barrier layer 13 made of undoped $In_{0.15}Ga_{0.75}N$ having a band gap energy which is between that of the carrier layer and that of the well layer is grown to the thickness of 10 angstroms. This three-layered structure constructed of the barrier layer, the well layer and the first barrier layer is laminated four more times and finally, the barrier layer is formed. Thus, the active layer 106 in a multi quantum well (MQW) structure having a total thickness of 1400 angstroms is formed. As mentioned above, other constructions are the same as those in Example 3 except that the band gap energy of the first barrier layer 13 is lower than that of the barrier layer and higher than that of the well layer. The resulting device showed a driving voltage of 4.0 V, which did not decrease.

Example 4

The LED device was fabricated in the same manner as in Example 3 except that the first barrier layer 13 in the active layer 106*f* was made of $Al_{0.45}Ga_{0.55}N$.

The resulting LED device showed a blue light emission of 470 nm under the forward current of 20 mA and a driving voltage of 3.0 V. The surface morphology of the first barrier layer 13 during a temperature rise up to the growing temperature of the barrier layer is shown in FIG. 16.

Example 5

The LED device was fabricated in the same manner as in Example 3 except that the first barrier layer 13 in the active layer 106*f*, was made of $Al_{0.60}Ga_{0.40}N$.

The resulting LED device showed a blue light emission of 470 nm under the forward current of 20 mA and a driving voltage of 2.8 V. The surface morphology of the first barrier layer 13 during a temperature rise up to the growing temperature of the barrier layer is shown in FIG. 17.

Example 6

The LED device was fabricated in the same manner as in Example 3 except that the first barrier layer 13 in the active layer 106*f* was made of $Al_{0.15}Ga_{0.85}N$.

The resulting LED device showed a blue light emission of 470 nm under the forward current of 20 mA and a driving voltage of 3.6 V. The surface morphology of the first barrier layer 13 during a temperature rise up to the growing temperature of the barrier layer is shown in FIG. 14.

Example 7

The LED device was fabricated in the same manner as in Example 3 except that the active layer 106*f* was formed in the following manner.

(Active Layer 207)

At 1050° C., a second barrier layer 11 made of $In_{0.1}Ga_{0.9}N$ doped with Si to $5 \times 10^{17}/cm^3$ is grown to the thickness of 200 angstroms using TMG, TMI, ammonia and silane gas. Subsequently, at 820° C., a well layer 12 made of $In_{0.8}Ga_{0.2}N$ is grown to the thickness of 30 angstroms using TMG, TMI and ammonia. Further, a first barrier layer 13 made of undoped $In_{0.3}Ga_{0.7}N$ is grown to the thickness of 10 angstroms using TMG, TMA and ammonia. This three-layered structure constructed of the second barrier layer 13, the well layer 12 and the first barrier layer 13 is laminated four more times and finally, the second barrier layer 13 is formed. Thus, the active layer 207 in a multi quantum well (MQW) structure having a total thickness of 1400 angstroms is formed.

As mentioned above, other constructions are the same as those in Example 3 except that the mixing proportion of In in the well layer 12 is 0.8. The resulting device showed a yellow light emission of 570 nm under a forward current of 20 mA and a driving voltage of 2.9 V, which decreased extremely compared to the driving voltage of 3.7 V resulted from the device in which no first barrier layer 13 was formed and other constructions were the same.

What is claimed is:

1. A light emitting device having an n-type semiconductor layer, a p-type semiconductor layer and an active layer between the n-type semiconductor layer and the p-type semiconductor layer, wherein the active layer comprises a well layer made of $In_{x1}Ga_{1-x1}N$ and a first barrier layer made of $Al_{y2}Ga_{1-y2}N$ formed on the well layer, said x1 being set to be not less than 0.6, said y2 being set to be not less than 0.15, wherein said active layer comprises a second barrier layer made of $In_{x3}Al_{y3}Ga_{1-x3-y3}N$, (0 x3 0.3, 0 y3 0.1, x3+y3 0.3) and said well layer is formed on said second barrier layer.

2. A light emitting device according to claim 1; wherein the y2 of said first barrier layer is set to be not less than 0.2.

3. A light emitting device according to claim 1; wherein said second barrier layer made of $In_{x3}Ga_{1-x3}N$ (0 x3 03).

4. A light emitting device according to claim 2; wherein said second barrier layer is made of $In_{x3}Ga_{1-x3}N$ (0 x3 0.3).

5. A light emitting device according to claim 1; wherein said well layer, said first barrier layer and said second barrier layer compose a series of multi layers and wherein said active layer includes a plurality of said series of multi layers so as to compose a multiple quantum well structure.

6. A light emitting device according to claim 2; wherein said well layer, said first barrier layer and said second barrier layer compose a series of multi layers and wherein said active layer includes a plurality of said series of multi layers so as to compose a multiple quantum well structure.

7. A light emitting device according to claim 3; wherein said well layer, said first barrier layer and said second barrier layer compose a series of multi layers and wherein said active layer includes a plurality of said series of multi layers so as to compose a multiple quantum well structure.

8. A light emitting device according to claim 4; wherein said well layer, said first barrier layer and said second barrier layer compose a series of multi layers and wherein said active layer includes a plurality of said series of multi layers so as to compose a multiple quantum well structure.

9. A light emitting device as in one of claims 1–8; wherein said n-type semiconductor layer comprises an n-type cladding layer to confine the carrier within the active layer and an n-side second cladding layer made of nitride semiconductor containing In between said active layer and said n-type cladding layer, wherein said p-type semiconductor layer comprises a p-type cladding layer to confine the carrier within the active layer and a p-side second cladding layer made of nitride semiconductor containing In between said active layer and said p-type cladding layer.

10. A light emitting device having an n-type semiconductor layer, a p-type semiconductor layer and an active layer between the n-type semiconductor layer and the p-type semiconductor layer, wherein the active layer comprises a well layer made of $In_{x1}Ga_{1-x1}N$ (x1>0) and a first barrier layer made of $Al_{y2}Ga_{1-y2}N$ formed on the well layer, said y2 being set to be not less than 0.15, said x1 being set so that said well layer is capable of emitting a light having a wavelength of not less than 530 nm, wherein said active layer comprises a second barrier layer made of $In_{x3}Al_{y3}Ga_{1-x3-y3}N$, (0 x3 0.3, 0 y3 0.1, x3+y3 0.3) and said well layer is formed on said second barrier layer.

11. A light emitting device according to claim 10;
wherein the y2 of said first barrier layer is set to be not less than 0.2.

12. A light emitting device according to claim 10;
wherein said second barrier layer made of $In_{x3}Ga_{1-x3}N$ (0 x3 03).

13. A light emitting device according to claim 11;
wherein said second barrier layer is made of $In_{x3}Ga_{1-y3}N$ (0 x3 0.3).

14. A light emitting device according to claim 10;
wherein said well layer, said first barrier layer and said second barrier layer compose a series of multi layers and wherein said active layer includes a plurality of said series of multi layers so as to compose a multiple quantum well structure.

15. A light emitting device according to claim 11;
wherein said well layer, said first barrier layer and said second barrier layer compose a series of multi layers and wherein said active layer includes a plurality of said series of multi layers so as to compose a multiple quantum well structure.

16. A light emitting device according to claim 12;
wherein said well layer, said first barrier layer and said second barrier layer compose a series of multi layers and wherein said active layer includes a plurality of said series of multi layers so as to compose a multiple quantum well structure.

17. A light emitting device according to claim 13;
wherein said well layer, said first barrier layer and said second barrier layer compose a series of multi layers and wherein said active layer includes a plurality of said series of multi layers so as to compose a multiple quantum well structure.

18. A light emitting device as in one of claim 10–17;
wherein said n-type semiconductor layer comprises an n-type cladding layer to confine the carrier within the active layer and an n-side second cladding layer made of nitride semiconductor containing In between said active layer and said n-type cladding layer, wherein said p-type semiconductor layer comprises a p-type cladding layer to confine the carrier within the active layer and a p-side second cladding layer made of nitride semiconductor containing In between said active layer and said p-type cladding layer.

19. A light emitting device having an n-type semiconductor layer, a p-type semiconductor layer and an active layer between the n-type semiconductor layer and the p-type semiconductor layer, wherein the active layer comprises a well layer made of $In_{x1}Ga_{1-x1}N(x1>0)$, a first barrier layer made of $Al_{y2}Ga_{1-y2}N(y2\ 0.3)$ formed on the well layer and a second barrier layer made of $In_{x3}Al_{y3}Ga_{1-x3-y3}N$, (0 x3 0.3, 0 y3 0.1, x3+y3 0.3), said well layer being formed on said second barrier layer.

20. A light emitting device according to claim 14;
wherein said second barrier layer is made of $In_{x3}Ga_{1-x3}N$ (0 x3 0.3).

21. A light emitting device according to claim 14;
wherein said well layer, said first barrier layer and said second barrier layer compose a series of multi layers and wherein said active layer includes a plurality of said series of multi layers so as to compose a multiple quantum well structure.

22. A light emitting device according to claim 20;
wherein said well layer, said first barrier layer and said second barrier layer compose a series of multi layers and wherein said active layer includes a plurality of said series of multi layers so as to compose a multiple quantum well structure.

23. A light emitting device as in one of claims 19–22;
wherein said n-type semiconductor layer comprises an n-type cladding layer to confine the carrier within the active layer and an n-side second cladding layer made of nitride semiconductor containing In between said active layer and said n-type cladding layer, wherein said p-type semiconductor layer comprises a p-type cladding layer to confine the carrier within the active layer and a p-side second cladding layer made of nitride semiconductor containing In between said active layer and said p-type cladding layer.

* * * * *

UNITED STATES PATENT AND TRADEMARK OFFICE
CERTIFICATE OF CORRECTION

PATENT NO. : 6,738,175 B2
DATED : May 18, 2004
INVENTOR(S) : Morita, D. et al.

It is certified that error appears in the above-identified patent and that said Letters Patent is hereby corrected as shown below:

Column 24,
Line 14, should read -- $(0 \leq x3 \leq 0.3, 0 \leq y3 \leq 0.1, x3 + y3 \leq 0.3)$; --
Lines 21 and 24, should read -- $(0 \leq x3 \leq 0.3)$. --

Column 25,
Line 6, should read -- $(0 \leq x3 \leq 0.3, 0 \leq y3 \leq 0.1, x3+y3 \leq 0.3)$; --
Line 14, should read -- $(0 \leq x3 \leq 0.3)$; -- and
Line 17, should read -- $(0 \leq x3 \leq 0.3)$. --

Column 26,
Line 14, should read -- $(y2 \geq 0.3)$; --
Line 15, should read -- $(0 \leq x3 \leq 0.3, 0 \leq y3 \leq 0.1, x3+y3 \leq 0.3)$; -- and
Line 19, should read -- $(0 \leq x3 \leq 0.3)$. --

Signed and Sealed this

Twenty-first Day of September, 2004

JON W. DUDAS
*Director of the United States Patent and Trademark Office*